United States Patent
Ishizaki et al.

(10) Patent No.: US 7,907,473 B2
(45) Date of Patent: Mar. 15, 2011

(54) SEMICONDUCTOR MEMORY DEVICE AND DATA STORAGE METHOD INCLUDING ADDRESS CONVERSION CIRCUIT TO CONVERT COORDINATE INFORMATION OF DATA INTO ONE-DIMENSIONAL INFORMATION TO AMPLIFIER

(75) Inventors: Tatsuya Ishizaki, Kanagawa (JP); Hironori Nakamura, Kanagawa (JP); Takayuki Kurokawa, Kanagawa (JP); Kenichi Ushikoshi, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 302 days.

(21) Appl. No.: 12/216,673

(22) Filed: Jul. 9, 2008

(65) Prior Publication Data

US 2009/0027993 A1    Jan. 29, 2009

(30) Foreign Application Priority Data

Jul. 23, 2007   (JP) ................................. 2007-190887
Jan. 10, 2008   (JP) ................................. 2008-003438

(51) Int. Cl.
*G11C 8/00*         (2006.01)
(52) U.S. Cl. ..................... 365/238; 365/222; 365/230.03
(58) Field of Classification Search .................. 365/49.1, 365/49.16, 49.18, 230.06, 238, 230.03, 205, 365/207, 222

See application file for complete search history.

(56) References Cited

U.S. PATENT DOCUMENTS

| 5,917,770 A | 6/1999 | Tanaka |
| 6,259,636 B1 * | 7/2001 | Fukuda et al. ................. 365/200 |
| 7,020,033 B2 * | 3/2006 | Nagata et al. ................. 365/200 |
| 7,388,781 B2 * | 6/2008 | Litsyn et al. ............. 365/185.09 |

FOREIGN PATENT DOCUMENTS

| JP | 5-120121 | 5/1993 |
| JP | 5-257458 | 10/1993 |
| JP | 9-259035 | 10/1997 |
| JP | 10-112179 | 4/1998 |

* cited by examiner

*Primary Examiner* — Richard Elms
*Assistant Examiner* — Hien N Nguyen
(74) *Attorney, Agent, or Firm* — McGinn Intellectual Property Law Group, PLLC

(57) ABSTRACT

A semiconductor memory device for storing data defining a multidimensional space based on coordinate information of the data, includes: a cell array having memory cells arranged in a lattice pattern, for storing the data; a word line selector selecting and driving any one of a plurality of word lines which activate memory cells arranged in a row direction; write amplifiers/sense amplifiers writing/reading data to/from the memory cells arranged in a column direction; an amplifier selector inputting/outputting the data to/from the selected one of the write amplifiers/sense amplifiers; and an address conversion circuit generating a row address to be supplied to the word line selector based on the coordinate information of the data, and to generate a column address to be supplied to the amplifier selector by converting the coordinate information of the data into one-dimensional information.

13 Claims, 44 Drawing Sheets

| | | X ADDRESS | | | | | | | |
|---|---|---|---|---|---|---|---|---|---|
| | | 0 | 1 | 2 | 3 | 4 | 5 | 6 | 7 |
| Y ADDRESS | 0 | | | | | | | | |
| | 1 | | | | Q0 | | | | |
| | 2 | | | Q1 | | Q2 | | | |
| | 3 | | Q3 | | | | Q4 | | |
| | 4 | | Q5 | | | | Q6 | | |
| | 5 | | Q7 | Q8 | Q9 | Q10 | Q11 | | |
| | 6 | | Q12 | | | | Q13 | | |
| | 7 | | | | | | | | |

Fig. 7

|   | X ADDRESS | | | | | | | |
|---|---|---|---|---|---|---|---|---|
| Y ADDRESS | 0 | 1 | 2 | 3 | 4 | 5 | 6 | 7 |
| 0 | | | | | | | | |
| 1 | | | | | | | | |
| 2 | Q0 | Q1 | Q2 | Q3 | Q4 | Q5 | Q6 | Q7 |
| 3 | | | | | | | | |
| 4 | | | | | | | | |
| 5 | | | | | | | | |
| 6 | | | | | | | | |
| 7 | | | | | | | | |

Fig. 9

|  | X ADDRESS | | | | | | | |
|---|---|---|---|---|---|---|---|---|
| Y ADDRESS | 0 | 1 | 2 | 3 | 4 | 5 | 6 | 7 |
| 0 | Q0 | | | | | | | |
| 1 | | Q1 | | | | | | |
| 2 | | | Q2 | | | | | |
| 3 | | | | Q3 | | | | |
| 4 | | | | | Q4 | | | |
| 5 | | | | | | Q5 | | |
| 6 | | | | | | | Q6 | |
| 7 | | | | | | | | Q7 |

Fig. 11

| Y ADDRESS \ X ADDRESS | 0 | 1 | 2 | 3 | 4 | 5 | 6 | 7 |
|---|---|---|---|---|---|---|---|---|
| 0 | Q0 | | | Q0 | | Q0 | | Q0 |
| 1 | Q1 | | | Q1 | | Q1 | | Q1 |
| 2 | Q2 | | | Q2 | | Q2 | | Q2 |
| 3 | Q3 | | | Q3 | | Q3 | | Q3 |
| 4 | Q4 | | | Q4 | | Q4 | | Q4 |
| 5 | Q5 | | | Q5 | | Q5 | | Q5 |
| 6 | Q6 | | | Q6 | | Q6 | | Q6 |
| 7 | Q7 | | | Q7 | | Q7 | | Q7 |

Fig. 13

|   | X ADDRESS | | | | | | | |
|---|---|---|---|---|---|---|---|---|
| Y ADDRESS | | 0 | 1 | 2 | 3 | 4 | 5 | 6 | 7 |
| | 0 | Q0 | Q0 | Q0 | Q0 | Q0 | Q0 | | |
| | 1 | Q1 | Q1 | Q1 | Q1 | Q1 | Q1 | | |
| | 2 | Q2 | Q2 | Q2 | Q2 | Q2 | Q2 | | |
| | 3 | Q3 | Q3 | Q3 | Q3 | Q3 | Q3 | | |
| | 4 | Q4 | Q4 | Q4 | Q4 | Q4 | Q4 | | |
| | 5 | Q5 | Q5 | Q5 | Q5 | Q5 | Q5 | | |
| | 6 | Q6 | Q6 | Q6 | Q6 | Q6 | Q6 | | |
| | 7 | Q7 | Q7 | Q7 | Q7 | Q7 | Q7 | | |

Fig. 15

|  | TYPICAL SDRAM | SDRAM OF THE PRESENT INVENTION |
|---|---|---|
| tRCD | a (ns) | a (ns) |
| LATENCY | b (ns) | b (ns) |
| tCK | c (ns) | c (ns) |
| tRP | d (ns) | d (ns) |
| PROCESSING TIME WHEN (2X2)-IMAGE IS ACCESSED | 2(a+b+2c+d) | a+b+4c+d |
| RATIO OF TIME FOR PROCESSING EXCLUDING ITEMS RELATED TO"c" | 100 | 50 |
| PROCESSING TIME WHEN (4X4)-IMAGE IS ACCESSED | 4(a+b+4c+d) | a+b+16c+d |
| RATIO OF TIME FOR PROCESSING EXCLUDING ITEMS RELATED TO"c" | 100 | 25 |
| PROCESSING TIME WHEN (8X8)-IMAGE IS ACCESSED | 8(a+b+8c+d) | a+b+64c+d |
| RATIO OF TIME FOR PROCESSING EXCLUDING ITEMS RELATED TO"c" | 100 | 12.5 |

Fig. 17

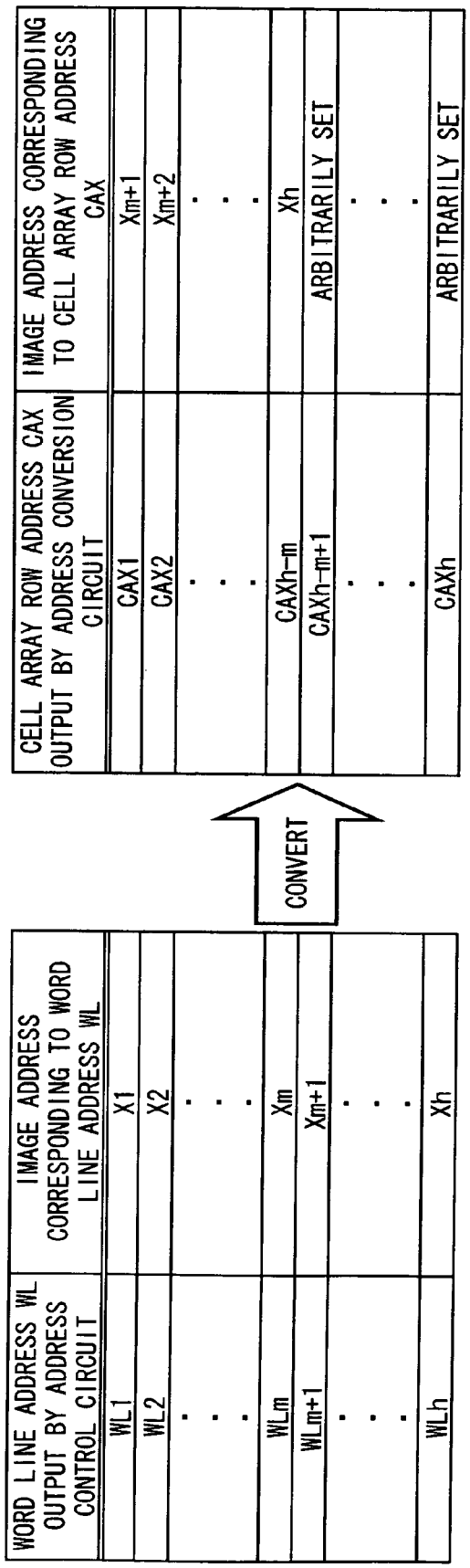

Fig. 18

(CELL ARRAY ROW ADDRESS CAX OF MEMORY CELL ARRAY) = h BIT, (NUMBER OF WORD LINES) = $2^h$
(CELL ARRAY COLUMN ADDRESS CAY OF MEMORY CELL ARRAY) = v BIT, (NUMBER OF AMPLIFIERS) = $2^v$
(WORD LINE ADDRESS WL OUTPUT BY ADDRESS CONTROL CIRCUIT) = h BIT
(BIT LINE ADDRESS BL OUTPUT BY ADDRESS CONTROL CIRCUIT) = v BIT
(ADDRESS X IN X-AXIS DIRECTION OF IMAGE TO BE HANDLED) = m BIT
(ADDRESS Y IN Y-AXIS DIRECTION OF IMAGE TO BE HANDLED) = n BIT
(ADDRESS Z IN Z-AXIS DIRECTION OF IMAGE TO BE HANDLED) = o BIT

| | | X ADDRESS | | | | | | | |
|---|---|---|---|---|---|---|---|---|---|
| | | 0 | 1 | 2 | 3 | 4 | 5 | 6 | 7 |
| Y ADDRESS | 0 | Q0 | Q4 | Q8 | QC | QG | QK | QO | QS |
| | 1 | Q1 | Q5 | Q9 | QD | QH | QL | QP | QT |
| | 2 | Q2 | Q6 | QA | QE | QI | QM | QQ | QU |
| | 3 | Q3 | Q7 | QB | QF | QJ | QN | QR | QV |
| | 4 | | | | | | | | |
| | 5 | | | | | | | | |
| | 6 | | | | | | | | |
| | 7 | | | | | | | | |

SEMICONDUCTOR MEMORY DEVICE AND DATA STORAGE METHOD INCLUDING ADDRESS CONVERSION CIRCUIT TO CONVERT COORDINATE INFORMATION OF DATA INTO ONE-DIMENSIONAL INFORMATION TO AMPLIFIER

BACKGROUND OF THE INVENTION

1. Field of the Invention

The present invention relates to a semiconductor memory device and a data storage method. In particular, the present invention relates to a semiconductor memory device including a cell array having memory cells arranged in a lattice pattern, and a data storage method for a semiconductor memory device.

2. Description of Related Art

In recent years, with the advancement of information processing technologies, there is a demand for an increase in data processing speed. In information processing such as a matrix calculation or image processing, data defining a multidimensional space is handled in some cases. For example, in the image processing, along with the achievement of higher definition of a display device, there is a demand for displaying more pixels at higher speed. In view of this, there is proposed a technique in which, by using a memory device having memory cells arranged in a lattice pattern, a multidimensional space is reproduced in the memory device and an address in the space of data is associated with an address in the memory device, to thereby increase the data processing speed. Examples of such a data processing method are disclosed in Japanese Unexamined Patent Application Publication No. 05-120121, Japanese Unexamined Patent Application Publication No. 09-259035, Japanese Unexamined Patent Application Publication No. 10-112179, and Japanese Unexamined Patent Application Publication No. 05-257458.

FIG. 41 shows a block diagram of a semiconductor memory device disclosed in Japanese Unexamined Patent Application Publication No. 05-120121. In this example, image data is stored in an information storage unit having memory cells two-dimensionally arranged. Further, a temporary row/column number generation unit 102, a column corresponding conversion unit 103, and a row corresponding conversion unit 104 are used to replace a row number and a column number for specifying memory cells. Thus, with the technology disclosed in Japanese Unexamined Patent Application Publication No. 05-120121, row/column replacement processing for image data can be carried out at high speed.

FIG. 42 shows a block diagram of a semiconductor memory device disclosed in Japanese Unexamined Patent Application Publication No. 09-259035. In this example, a two-dimensional image is temporarily written into a memory cell array 210 before a combination of a row address and a column address is changed by using selection circuits M1 and M2, whereby rotation transformation processing or linear symmetric transformation processing for an image is performed. Thus, with the technology disclosed in Japanese Unexamined Patent Application Publication No. 09-259035, the rotation transformation processing or the linear symmetric transformation processing for an image can be carried out at high speed.

FIG. 43 shows a block diagram of a semiconductor memory device disclosed in Japanese Unexamined Patent Application Publication No. 10-112179. In this example, the semiconductor memory device includes a plurality of sub-arrays 306-0 to 306-7. Pieces of data in different rows among pieces of rectangle data are stored in different sub-arrays. Then, writing and reading of data are performed in parallel, whereby the increase in processing speed is achieved.

FIG. 44 shows a block diagram of a semiconductor memory device disclosed in Japanese Unexamined Patent Application Publication No. 05-257458. In this example, the semiconductor memory device includes an address conversion unit 402 for converting a logical address of each pixel forming an image, into a physical address indicating a location of a cell in a memory. Further, the address conversion unit 402 generates the physical address so that pixel data is arranged in the memory with high efficiency. Thus, with the technology disclosed in Japanese Unexamined Patent Application Publication No. 05-257458, an efficient use of a memory is achieved.

However, in the technologies disclosed in Japanese Unexamined Patent Application Publication No. 05-120121, Japanese Unexamined Patent Application Publication No. 09-259035, Japanese Unexamined Patent Application Publication No. 10-112179, and Japanese Unexamined Patent Application Publication No. 05-257458, image data is divided into cells, which are connected to different word lines, to be stored. When a dynamic random access memory (DRAM) is used as a memory device, in the memory, cells arranged in a row direction are selected by selecting any of the word lines, and cells arranged in a column direction are selected by selecting any of sense amplifiers. Accordingly, in the related arts, it is necessary to drive a plurality of word lines during a writing operation or a reading operation for image data. In view of the foregoing, in the technologies disclosed in Japanese Unexamined Patent Application Publication No. 05-120121, Japanese Unexamined Patent Application Publication No. 09-259035, Japanese Unexamined Patent Application Publication No. 10-112179, and Japanese Unexamined Patent Application Publication No. 05-257458, there arises a problem in that a power consumption increases according to the number of word lines to be driven. In the field of a semiconductor device mounted to a portable device or the like, there is a strong demand for a reduction in power consumption. Therefore, the increase in power consumption is a serious problem.

SUMMARY

In one embodiment of the present invention, there is provided a semiconductor memory device to store data defining a multidimensional space, based on coordinate information of the data, including: a cell array including memory cells arranged in a lattice pattern to store the data; a word line selector selecting and drive any one of a plurality of word lines to activate the memory cells arranged in a row direction; a plurality of write amplifiers and a plurality of sense amplifiers writing and reading the data to and from the memory cells arranged in a column direction; an amplifier selector selecting any one of the plurality of write amplifiers and of the plurality of sense amplifiers so as to input and output the data to and from selected one of the plurality of write amplifiers and of the plurality of sense amplifiers; and an address conversion circuit generating a row address to be supplied to the word line selector based on the coordinate information of the data, and to generate a column address to be supplied to the amplifier selector by converting the coordinate information of the data into one-dimensional information.

In another embodiment of the present invention, there is provided a data storage method for a semiconductor memory device including a cell array having memory cells arranged in a lattice pattern to store data defining a multidimensional space based on coordinate information of the data, the data storage method including: determining a row address at which the data is stored based on a single piece of coordinate information among the coordinate information of the data; and determining a column address at which the data is stored based on the coordinate information converted into one-dimensional information.

In the semiconductor memory device and the data storage method according to the present invention, by converting data defining a multidimensional space into one-dimensional information, all the data provided in a space can be stored in a plurality of cells specified by a single word line. Accordingly, by driving a single word line, data provided in one space can be arbitrarily accessed. In other words, in a case of accessing data provided in one space, there is no need to drive a plurality of word lines. Therefore, in the semiconductor memory device and the data storage method according to the present invention, a power consumption required for driving word lines during data access can be reduced.

In the semiconductor memory device and the data storage method according to the present invention, a power consumption required for the data access can be reduced.

BRIEF DESCRIPTION OF THE DRAWINGS

The above and other objects, advantages and features of the present invention will be more apparent from the following description of certain preferred embodiments taken in conjunction with the accompanying drawings, in which:

FIG. 7 is a diagram showing an image read by the semiconductor memory device according to Embodiment 1;

FIG. 9 is a diagram showing an image read by the semiconductor memory device according to Embodiment 1;

FIG. 11 is a diagram showing an image read by the semiconductor memory device according to Embodiment 1;

FIG. 13 is a diagram showing an image read by the semiconductor memory device according to Embodiment 1;

FIG. 15 is a diagram showing an image read by the semiconductor memory device according to Embodiment 1;

FIG. 17 is a diagram showing an example of comparison between data read times in the semiconductor memory device according to Embodiment 1 and those in a typical DRAM;

FIG. 18 is a diagram showing a conversion rule for address conversion performed in a case where an address conversion circuit according to Embodiment 2 of the present invention generates a cell array row address;

FIG. 28 is a diagram showing an image read by a semiconductor memory device according to Embodiment 7 of the present invention;

DETAILED DESCRIPTION OF THE PREFERRED EMBODIMENTS

The invention will now be described herein with reference to illustrative embodiments. Those skilled in the art will recognize that many alternative embodiments can be accomplished using the teachings of the present invention and that the invention is not limited to the embodiments illustrated for explanatory purposes.

Embodiment 1

Figure 1:
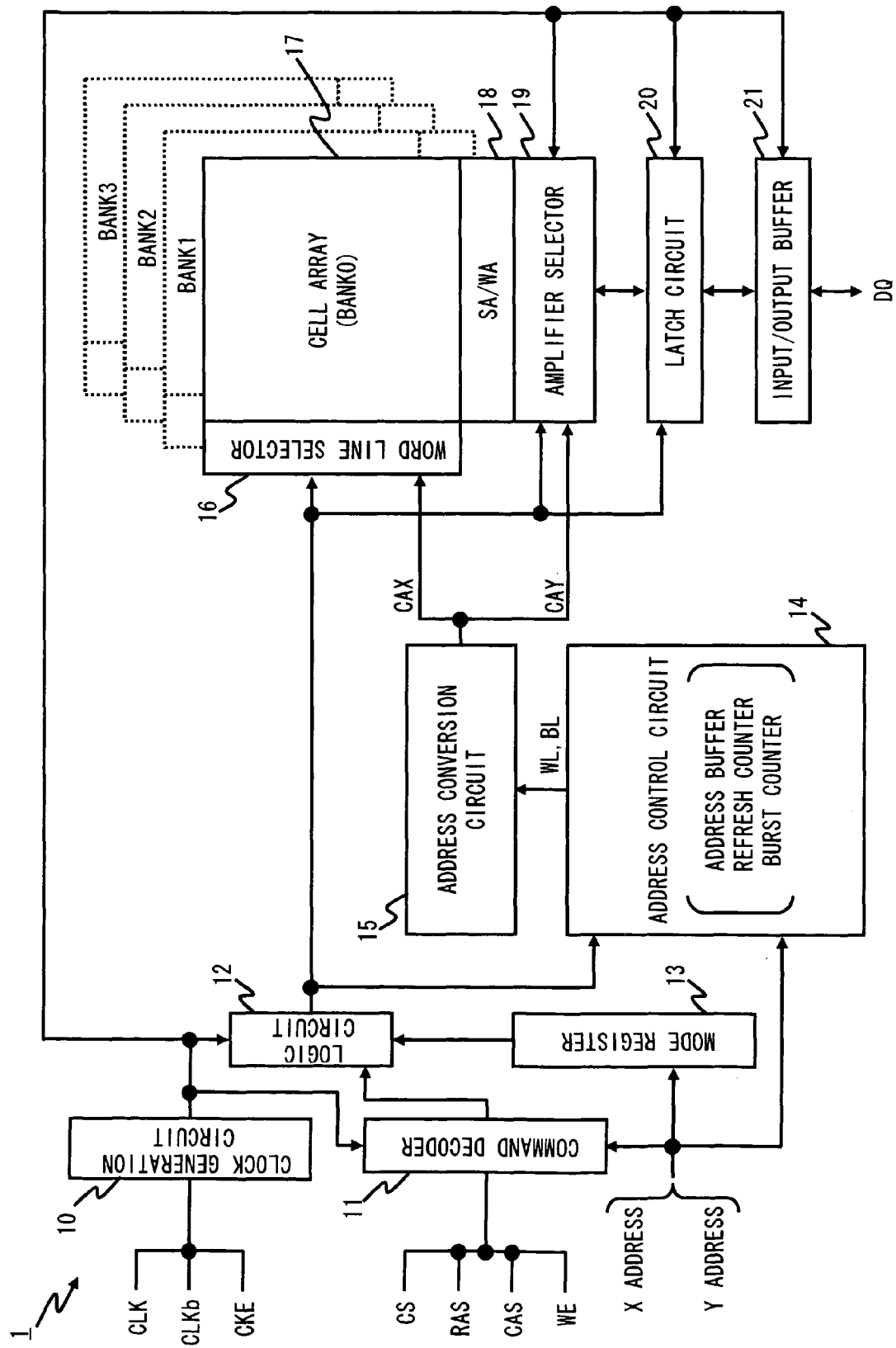
FIG. 1 is a block diagram showing a semiconductor memory device according to Embodiment 1 of the present invention.

Hereinafter, embodiments of the present invention will be described with reference to the drawings. In the following, a description is given of an example in which image information is handled as data defining a multidimensional space. The data to be handled includes coordinate information indicating a location in a space. For example, in a case of image data defining a two-dimensional space, each data includes an X address and a Y address. FIG. 1 shows a block diagram of a semiconductor memory device 1 according to Embodiment 1 of the present invention. As shown in FIG. 1, the semiconductor memory device 1 includes a clock generation circuit 10, a command decoder 11, a logic circuit 12, a mode register 13, an address control circuit 14, an address conversion circuit 15, a word line selector 16, a cell array 17, a write amplifier/sense amplifier 18, an amplifier selector 19, a latch circuit 20, and an input/output buffer 21.

The clock generation circuit 10 generates a clock signal to be used in the semiconductor memory device 1, based on a clock signal CLK, an inverted clock signal CLKb, and a clock enable signal CKE. The command decoder 11 decodes a command specified by a signal such as a chip select signal CS, a row address strobe (RAS) signal, a column address strobe (CAS) signal, or a write enable signal WE.

The logic circuit 12 generates a control signal for each of the address control circuit 14, the word line selector 16, the amplifier selector 19, and the latch circuit 20 in response to the command decoded by the command decoder 11 and according to an operation mode specified by the mode register. The mode register 13 specifies operation modes such as a burst mode and a normal operation mode, based on the X address and the Y address that are input from the outside.

The address control circuit 14 includes an address buffer, a refresh counter, and a burst counter. The address buffer temporarily stores the X address and the Y address that are input from the outside. The refresh counter, which is used in a DRAM, sets a refresh cycle of the DRAM and generates a refresh address thereof. The burst counter generates an address for specifying each memory cell in the cell array 17 in a burst operation for the memory. The address control circuit 14 outputs addresses generated by the address buffer, the refresh counter, and the burst counter as a word line address WL and a bit line address BL. The word line address WL specifies each position in a row direction of memory cells arranged in a lattice pattern in the cell array 17. The bit line address BL specifies each position in a column direction of memory cells arranged in a lattice pattern in the cell array 17. Further, the address control circuit 14 selects and outputs any one of the addresses output by the address buffer, the refresh counter, and the burst counter, in response to the control signal output by the logic circuit 12. Note that the word line address WL and the bit line address BL each indicate a single address by using a plurality of bits.

When the data to be input defines a space specified by the X address and the Y address, the address conversion circuit 15 generates, based on the coordinate information of the data, a single cell array row address CAX to be supplied to the word line selector 16, and generates a cell array column address CAY to be supplied to the amplifier selector 19 by converting the coordinate information of the data into one-dimensional information. In Embodiment 1, in place of the word line address and the bit line address, the cell array row address CAX and the cell array column address CAY are used to activate the memory cells of the cell array 17. For example, when the address control circuit 14 outputs the word line address WL based on the X address and outputs the bit line address BL based on the Y address, the address conversion circuit 15 generates a single cell array row address CAX by using an arbitrary number of bits of each of the word line address WL and the bit line address BL, and generates the cell array column address CAY by using a combination of the bits of each of the word line address WL and the bit line address BL, which are not used for generating the cell array row address CAX. The details of the address conversion circuit 15 is described later.

The cell array 17 includes a plurality of memory cells arranged in a lattice pattern. According to Embodiment 1, in the cell array 17, the number of memory cells arranged in a row direction is determined so that all the pixels in an image space can be fully stored. The word line selector 16 selects any one of the plurality of word lines based on the cell array row address CAX. The selected word line is connected with a plurality of memory cells arranged in the same row among the memory cells arranged in a lattice pattern. Thus, the word line selector 16 selects any one of the word lines, whereby the memory cells connected to the selected word line are activated. The write amplifier/sense amplifier 18 includes a plurality of pairs of a write amplifier and a sense amplifier. The plurality of pairs of the write amplifier and the sense amplifier are each connected to a bit line pair. The bit line pair includes two bit lines as a pair, and the bit line pair is handled as a row. The bit line pair is connected with a plurality of memory cells arranged in the same column among the memory cells arranged in a lattice pattern. The amplifier selector 19 selects any one of the plurality of pairs of the write amplifier and the sense amplifier based on the cell array column address CAY. Note that the semiconductor memory device 1 includes a plurality of sets of the cell array 17, the word line selector 16, and the write amplifier/sense amplifiers 18. The plurality of sets of those components are each referred to as a bank. In FIG. 1, BANKs 0 to 3 are shown. Unless otherwise specified, a description is given below of an operation for the BANK 0.

The latch circuit 20 includes a plurality of latch circuits. The latch circuit 20 loads data input from the outside, in synchronization with the clock signal output by the clock generation circuit 10, and outputs the data to the write amplifier selected by the amplifier selector 19. Further, the latch circuit 20 loads the data output from the sense amplifier selected by the amplifier selector 19, in synchronization with the clock signal output by the clock generation circuit 10, and outputs the data to the input/output buffer 21. The input/output buffer 21 outputs data DQ, which is input from the outside, to the latch circuit 20, and outputs the data DQ, which is output from the latch circuit 20, to the outside. It is assumed that the semiconductor memory device 1 performs input and output of data in parallel by using a plurality of data input/output terminals.

Figure 2:
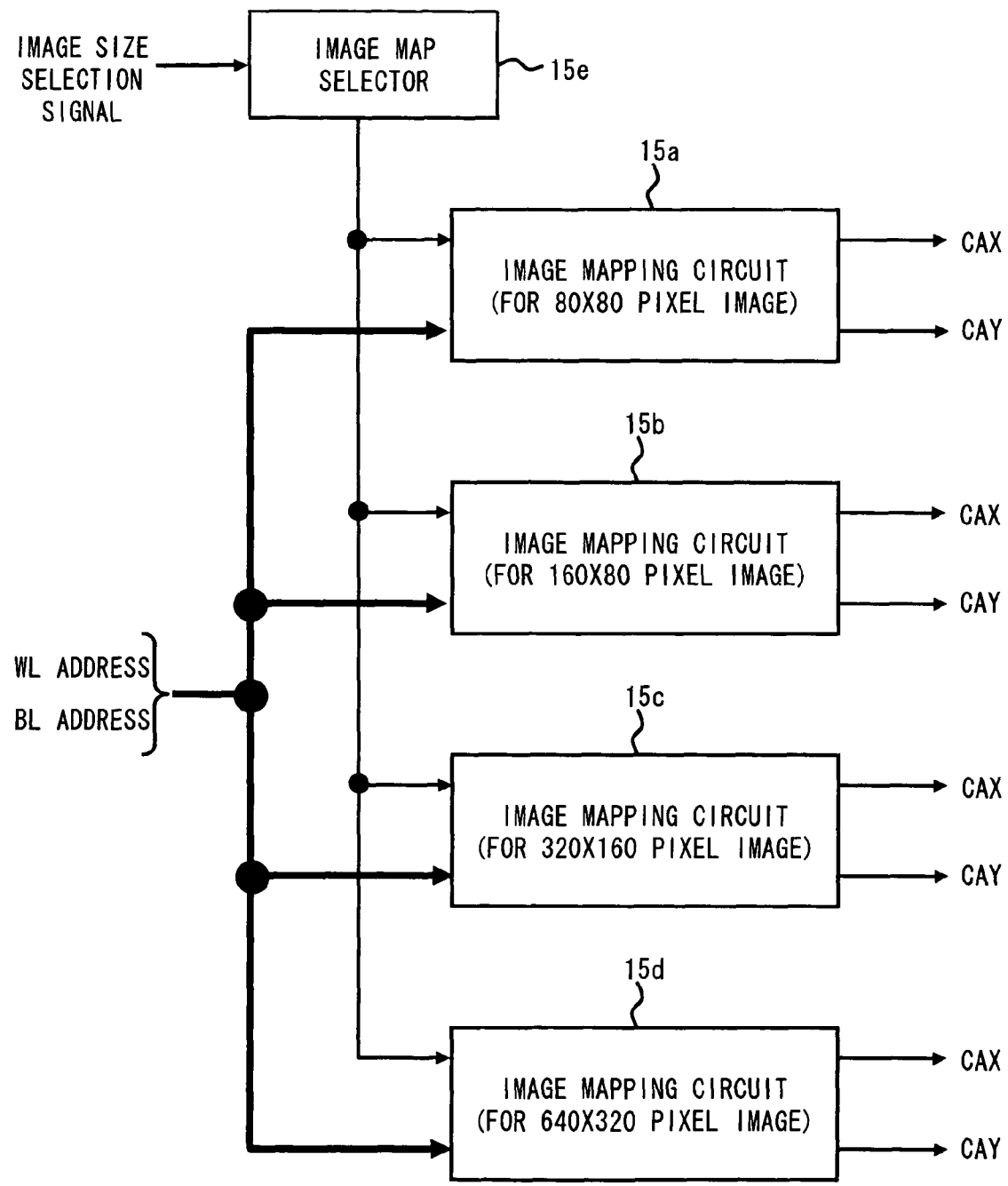
FIG. 2 is a block diagram showing an address conversion circuit according to Embodiment 1.

In this case, the address conversion circuit 15 is described in detail. FIG. 2 shows a block diagram of the address conversion circuit 15 according to Embodiment 1. As shown in FIG. 2, the address conversion circuit 15 includes image mapping circuits 15a to 15d and an image map selector 15e. In the image mapping circuits 15a to 15d, an address conversion method is predefined for each size of an image to be handled. For example, the image mapping circuit 15a handles an image having a size of 80 pixels in a vertical direction (Y-axis direction) and 80 pixels in a horizontal direction (X-axis direction). The image mapping circuits 15a to 15d each generate a single cell array row address CAX and a plurality of cell array column addresses CAY based on the word line address WL and the bit line address BL that are output from the address control circuit 14. The image mapping circuits 15a to 15d may perform address conversion by using a conversion table as an address conversion rule, or may perform address conversion by calculation. Alternatively, a combination of connections between bus wiring on an input side of the image mapping circuit and bus wiring on an output side thereof may be changed according to the size of an image to be handled. The address conversion is described later.

The image map selector 15e activates any one of the image mapping circuits 15a to 15d in response to an image size selection signal input from the outside, and disables the remaining image mapping circuits. Specifically, the address conversion circuit 15 performs address conversion in accordance with a rule set in the image mapping circuit selected in response to the image size selection signal.

Figure 3:
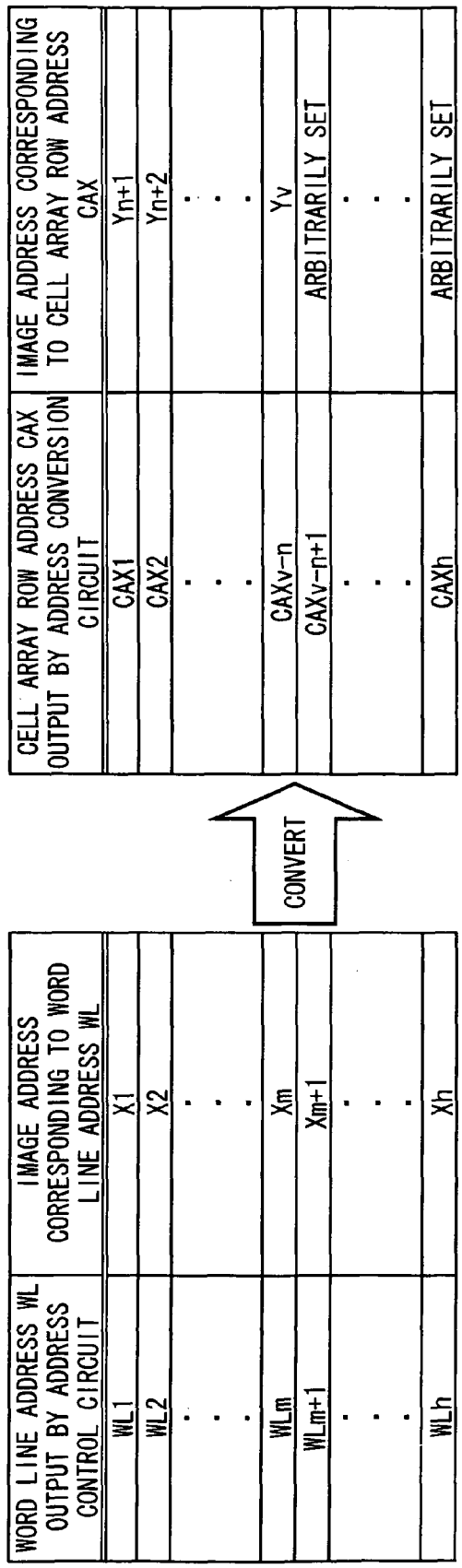
FIG. 3 is a diagram showing a conversion rule for address conversion performed in a case where an address conversion circuit according to Embodiment 1 generates a cell array row address.
Figure 4:
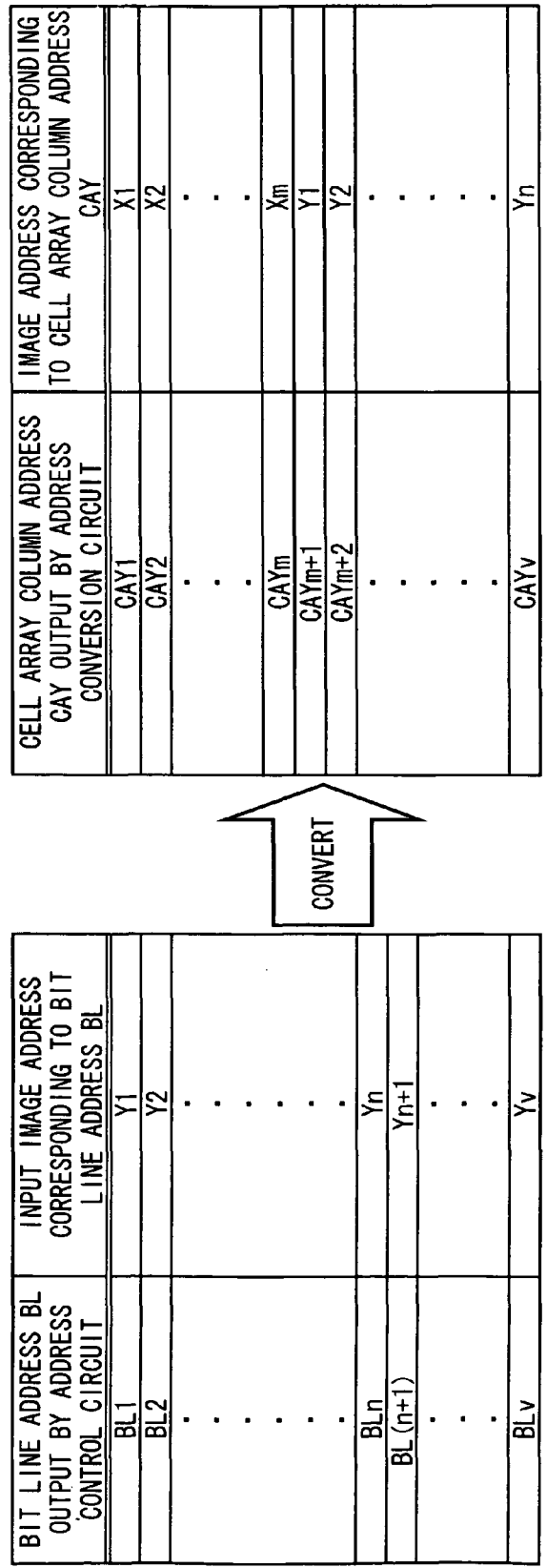
FIG. 4 is a diagram showing a conversion rule for address conversion performed in a case where the address conversion circuit according to Embodiment 1 generates a cell array column address.

Next, the address conversion is described in detail. Examples of the address conversion rule are shown in FIGS. 3 and 4. In the examples below, in order to generalize the conversion rule, it is assumed that the cell array row address CAX and the word line address WL output by the address control circuit 14 are formed with a bit width of h bits, and the cell array column address CAY and the bit line address BL output by the address control circuit 14 are formed with a bit width of v bits. Further, it is assumed that the address X of an image to be handled in the X-axis direction is made up of m bits, and the address Y of an image to be handled in the Y-axis direction is made up of n bits. In other words, the number of word lines provided in the cell array 17 is $2^h$, and the number of bit line pairs provided in the cell array 17 is $2^v$.

FIG. 3 shows an example of the conversion rule for address conversion from the word line address WL and the bit line address BL, which are output by the address control circuit 14, to the cell array row address CAX. In this example, an h-bit word line address WL is associated with the X address of the image. For example, a least significant bit WL1 of the word line address WL is associated with a least significant bit X1 of the X address. Then, the X address is defined using m bits of the word line address WL. In this case, bits from an (m+1)-th bit to an h-th bit (most significant bit) of the word line address have common values as coordinate addresses of pixels in an image space to be handled.

The address conversion circuit 15 generates the cell array row address CAX based on address information output by the address control circuit 14. In this example, the address conversion circuit 15 generates the cell array row address CAX by using the bit line address (for example, values of bits from (n+1)-th bit to v-th bit (most significant bit) of Y address) which is not used as a value representing the image space among the bit line addresses BL. For example, the bits from the (n+1)-th bit to the most significant bit of the Y address are associated with the bits of the cell array row address CAX in order from the least significant bit thereof. Bit values of the cell array row address CAX, which are not associated with any of the bit values of the Y address, can be arbitrarily set.

FIG. 4 shows an example of the conversion rule for address conversion from the word line address WL and the bit line address BL, which are output by the address control circuit 14, to the cell array column address CAY. In this example, a v-bit bit line address BL is associated with the Y address of the image. For example, a least significant bit BL1 of the bit line address BL is associated with a least significant bit Y1 of the Y address. Then, the Y address is defined using the n bits of the bit line address BL. In this case, bits from an (n+1)-th bit to a v-th bit (most significant bit) of the bit line address have common values as coordinate addresses of pixels in an image space to be handled.

The address conversion circuit 15 generates the cell array column address CAY based on address information output by the address control circuit. In this example, the address conversion circuit 15 generates the cell array column address CAY by using the word line address and the bit line address (for example, values of bits from least significant bit to m-th bit of X address and values of bits from least significant bit to n-th bit of Y address), which are used as values representing the image space, among the word line addresses WL and the bit line addresses BL. For example, as values of bits from the least significant bit to the m-th bit of the X address, values of bits from the least significant bit to the m-th bit of the X address are used. In addition, as values of bits from the (m+1)-th bit to the most significant bit of the cell array row address CAX, values of bits from the least significant bit to the n-th bit of the Y address are used.

Specifically, the address conversion circuit 15 generates a single cell array row address CAX by using bits of each of the X address and the Y address which have common values as space coordinates of an image to be handled. Further, the address conversion circuit 15 generates the cell array column address CAY by using bits of each of the X address and the Y address which have different values as space coordinates of an image to be handled. As a result, an image having a predetermined area can be stored in memory cells specified by a single cell array row address CAX. Note that the cell array row address CAX may be generated using either one of the X address and the Y address, or may be generated using a combination of the X address and the Y address. A correspondence relation between the bits of the cell array column address CAY and the bits of each of the X address and the Y address can be arbitrarily set depending on the situation.

Figure 5:
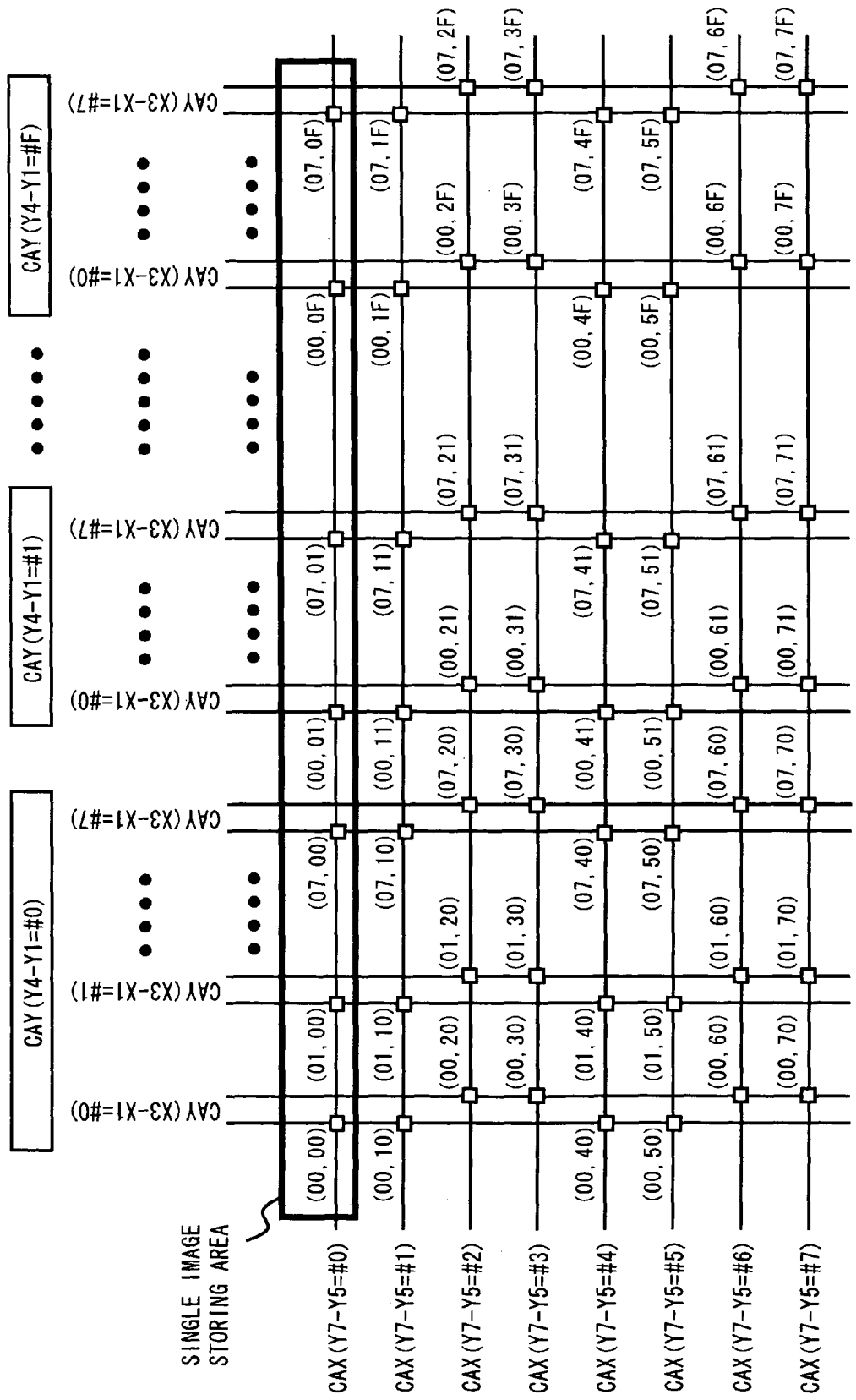
FIG. 5 is a diagram showing data storage positions in a cell array of the semiconductor memory device according to Embodiment 1.

Next, FIG. 5 shows data storage addresses obtained in a case where an image having a size of eight pixels in the X-axis direction and 16 pixels in the Y-axis direction is stored in the cell array 17 according to the conversion rule. In the image having the size of eight pixels in the X-axis direction and 16 pixels in the Y-axis direction, addresses of all the pixels in the image space can be expressed by using a 3-bit X address and a 4-bit Y address. In this example, highest-order three bits of the Y address are used as the cell array row address CAX, and lowest-order three bits of the X address are used as lowest-order three bits of the cell array column address CAY. In addition, lowest-order four bits of the Y address are used as highest-order four bits of the cell array column address CAY.

Figure 6:
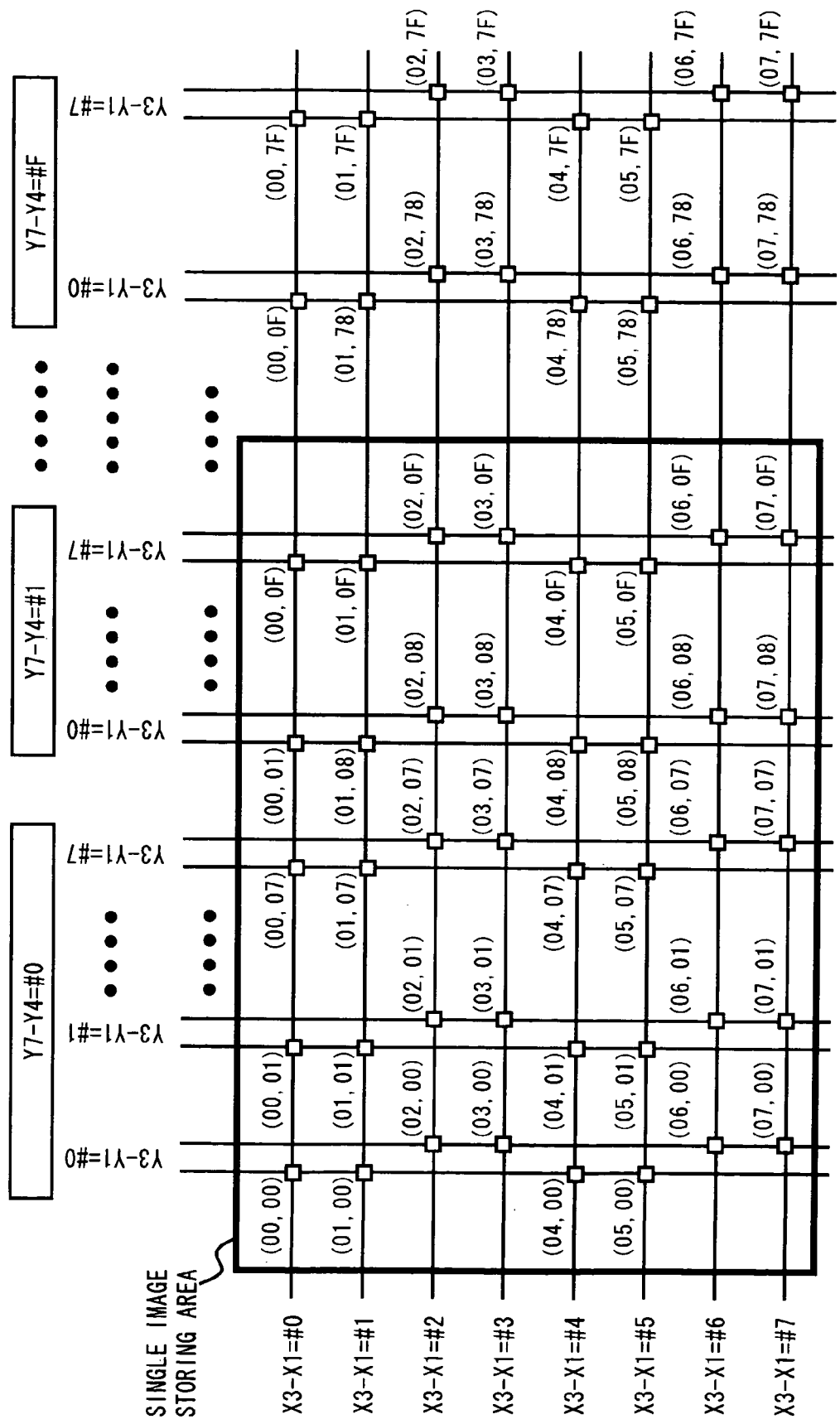
FIG. 6 is a diagram showing data storage positions in a cell array of a typical semiconductor memory device.

As shown in FIG. 5, an image having a Y address with highest-order three bits representing a value of "0" is stored in the memory cells connected to a single word line specified by an address value of "0". FIG. 6 shows data storage positions obtained in a case where the image having the same size is stored in the cell array 17 when the address conversion circuit 15 is not used. In this case, as shown in FIG. 6, the image is stored by using eight word lines and 16 bit line pairs.

Next, a data reading operation of the semiconductor memory device according to Embodiment 1 is described. In this case, a description is given of operations for reading five types of images each having the same image space of 8 pixels×8 pixels, for example. Examples of images to be read are shown in FIGS. 7, 9, 11, 13, and 15, and timing charts of the operations for reading those images are shown in FIGS. 8, 10, 12, 14, and 16. Note that, in the following description (including descriptions of examples below), as an example of the operations, the cell array row address CAX is controlled by using a part of the Y address, and the cell array column address CAY is controlled by using the remaining part of the X address and the Y address, which are not used for generating the cell array row address CAX. Thus, when the cell array row address CAX and the cell array column address CAY are generated using the combination of the X address and the Y address, specifications may be set such that the X address and the Y address that correspond to the cell array row address CAX and the cell array column address CAY can be input timely, and an appropriate change can be made depending on the specifications.

In a typical DRAM memory, a word line address of a memory cell is specified by the RAS signal. Then, after elapse of time determined by tRCD based on the RAS signal, a CAS signal is input so as to specify the bit line address. After the CAS signal is input, the data to be read is output after elapse of time determined by latency. Further, in a case of reading data stored in memory cells specified by a word line which is different from the specified word line, precharge is performed after all the data read from the specified word line address are output. Then, after elapse of time determined by tRP, the word line address and the bit line address are newly specified by the RAS signal and the CAS signal. Note that tRCD, latency, and tRP each indicate a time determined in the semiconductor memory device. The semiconductor memory device operates based on the clock signal CLK. A time corresponding to one cycle of the clock signal CLK is hereinafter referred to as tCK.

Figure 8:
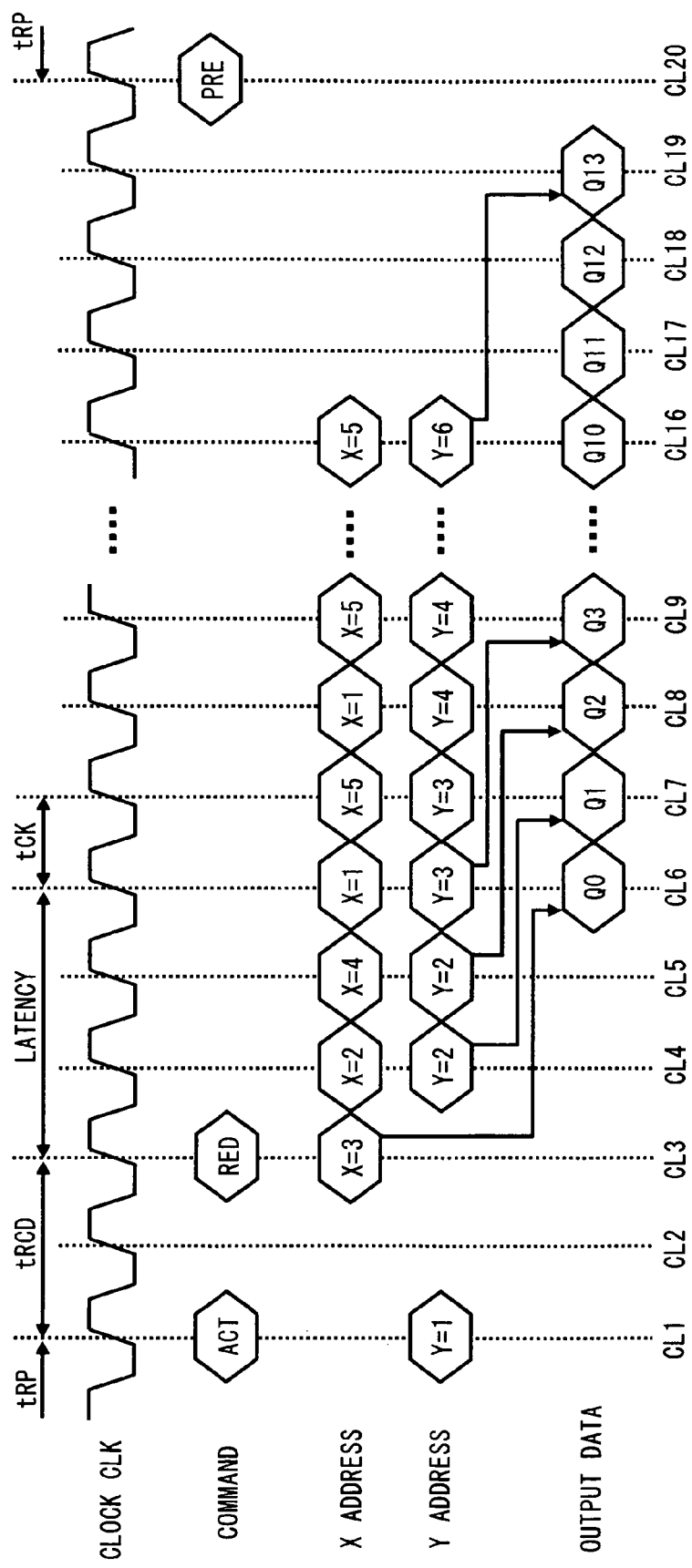
FIG. 8 is a timing chart showing an operation of the semiconductor memory device according to Embodiment 1.

First, an image shown in FIG. 7 represents a character "A" by using 14 pixels. FIG. 8 is a timing chart showing a case where 14 pieces of data representing the character "A" are read. As shown in FIG. 8, upon input of the RAS signal at a timing of a first clock CL1, the semiconductor memory device 1 receives an operation start command ACT. In this case, the Y address used as the cell array row address CAX is also input simultaneously. Then, the semiconductor memory device 1 receives the CAS signal at a timing of a third clock CL3, and also receives a read command RED. In this case, the X address used as a part of the cell array column address CAY is input. Then, after elapse of time determined by the latency, data Q0 is output. The data Q0 is data represented by a coordinate (Y=1, X=3) which is specified by the Y address input in synchronization with the first clock CL1 and by the X address input in synchronization with the third clock CL3.

In the semiconductor memory device 1, X addresses and Y addresses are sequentially input in synchronization with clocks after the third clock CL3, to thereby read 14 pieces of data selected based on the cell array column address CAY generated using the input addresses. In this example, 19 clocks are required during a period from the time when the RAS signal is input to the semiconductor memory device 1 to the time when reading of all the data is completed. In the semiconductor memory device 1, information on the pixels in the image space is stored in the memory cells activated by a single word line. Accordingly, the RAS signal and the CAS signal are not input until all the data are read. Further, a precharge operation is performed after all the data are read, and preparation for reading image data in another image space is made.

Figure 10:
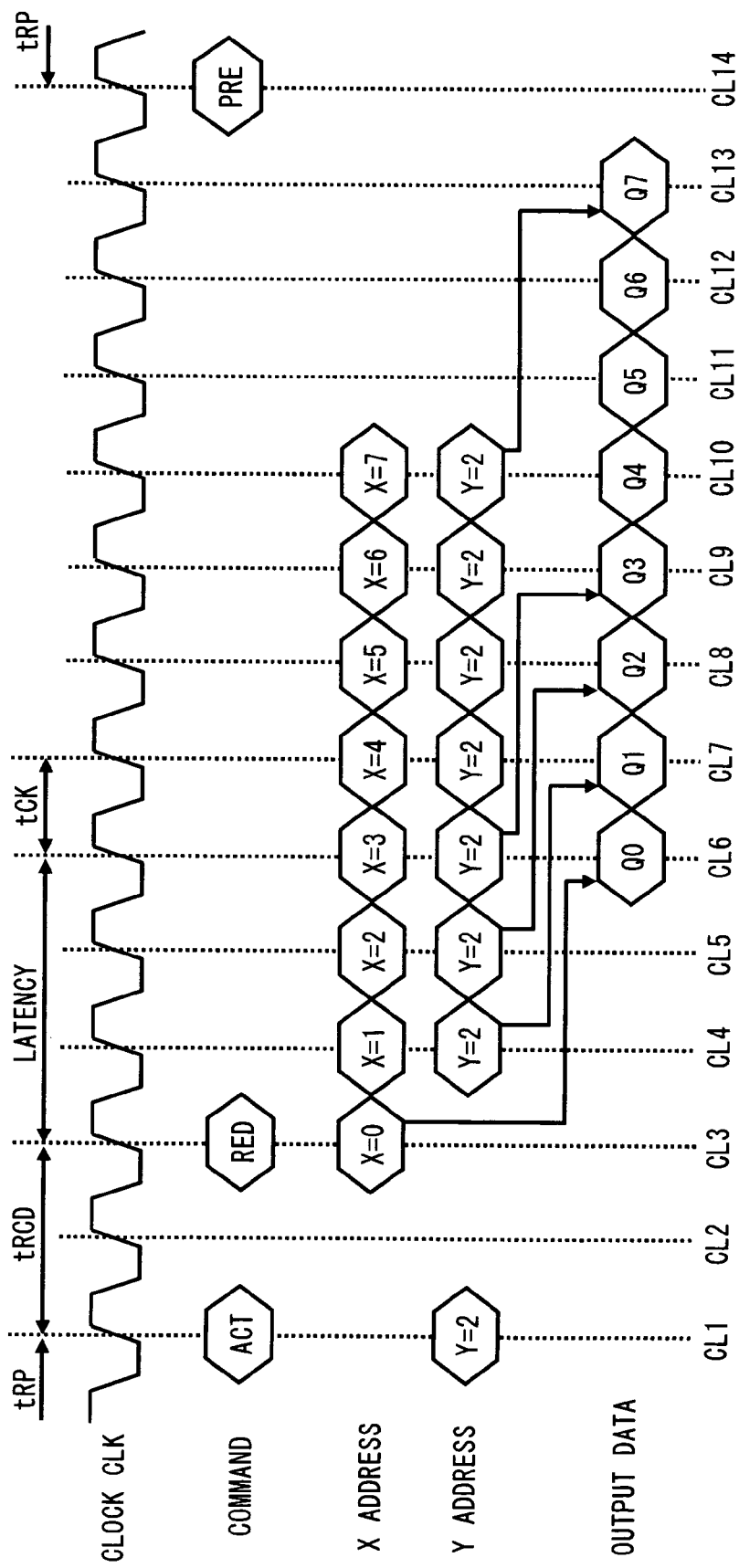
FIG. 10 is a timing chart showing an operation of the semiconductor memory device according to Embodiment 1

An image shown in FIG. 9 is a straight-line image formed by using eight pixels having coordinates in a column specified by a Y address of "2" in the image space. FIG. 10 is a timing chart showing a case where eight pieces of data representing the straight-line image are read. As shown in FIG. 10, upon input of the RAS signal at the timing of the first clock CL1, the semiconductor memory device 1 receives the operation start command ACT. In this case, the Y address used as the cell array row address CAX is also input simultaneously. Then, the semiconductor memory device 1 receives the CAS signal at the timing of the third clock CL3, and also receives the read command RED. At this time, the X address used as a part of the cell array column address CAY is input. Then, the data Q0 is output after elapse of time determined by the latency. The data Q0 is data represented by a coordinate (Y=2, X=0) which is specified by the Y address input in synchronization with the first clock CL1 and by the X address input in synchronization with the third clock CL3.

In the semiconductor memory device 1, X addresses and Y addresses are sequentially input in synchronization with clocks after the third clock CL3, to thereby read eight pieces of data. In this example, 13 clocks are required during a period from the time when the RAS signal is input to the semiconductor memory device 1 to the time when reading of all the data is completed. In the semiconductor memory device 1, information on the pixels in the image space is stored in the memory cells activated by a single word line. Accordingly, the RAS signal and the CAS signal are not input until all the data are read. Further, the precharge operation is performed after all the data are read, and the preparation for reading image data in another image space is made.

Figure 12:
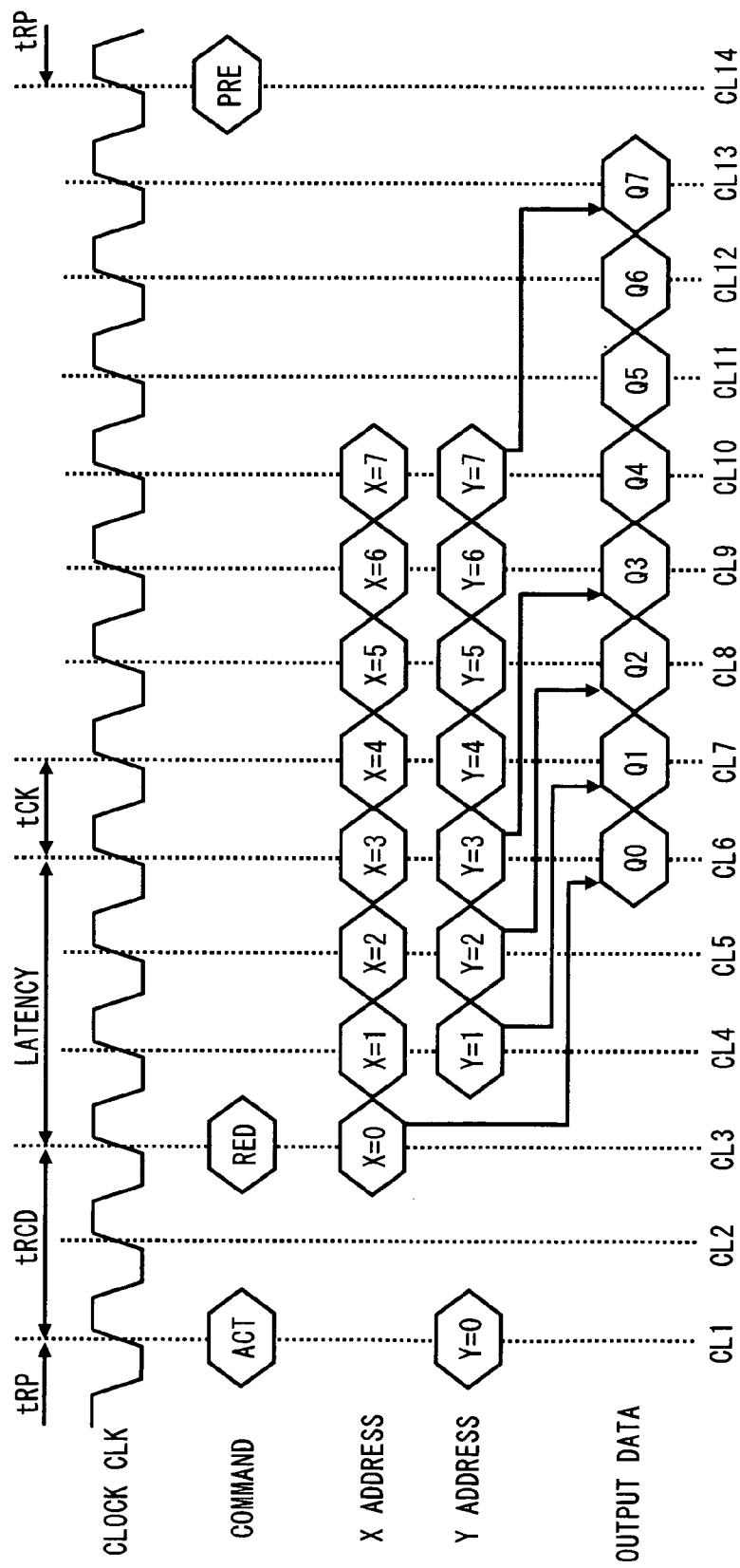
FIG. 12 is a timing chart showing an operation of the semiconductor memory device according to Embodiment 1.

An image shown in FIG. 11 includes eight pixels diagonally located in the image space. FIG. 12 is a timing chart showing a case where eight pieces of data representing a straight-line image extending diagonally. As shown in FIG. 12, upon input of the RAS signal at the timing of the first clock CL1, the semiconductor memory device 1 receives the operation start command ACT. In this case, the Y address used as the cell array row address CAX is also input simultaneously. Then, the semiconductor memory device 1 receives the CAS signal at the timing of the third clock CL3, and also receives the read command RED. At this time, the X address used as a part of the cell array column address CAY is input. Then, the data Q0 is output after elapse of time determined by the latency. The data Q0 is data represented by a coordinate (Y=0, X=0) which is specified by the Y address input in synchronization with the first clock CL1 and by the X address input in synchronization with the third clock CL3.

In the semiconductor memory device 1, X addresses and Y addresses are sequentially input in synchronization with clocks after the third clock CL3, to thereby read eight pieces of data. In this example, 13 clocks are required during a period from the time when the RAS signal is input to the semiconductor memory device 1 to the time when reading of all the data is completed. In the semiconductor memory device 1, information on the pixels in the image space is stored in the memory cells activated by a single word line. Accordingly, the RAS signal and the CAS signal are not input until all the data are read. Further, the precharge operation is performed after all the data are read, and the preparation for reading image data in another image space is made.

Figure 14:
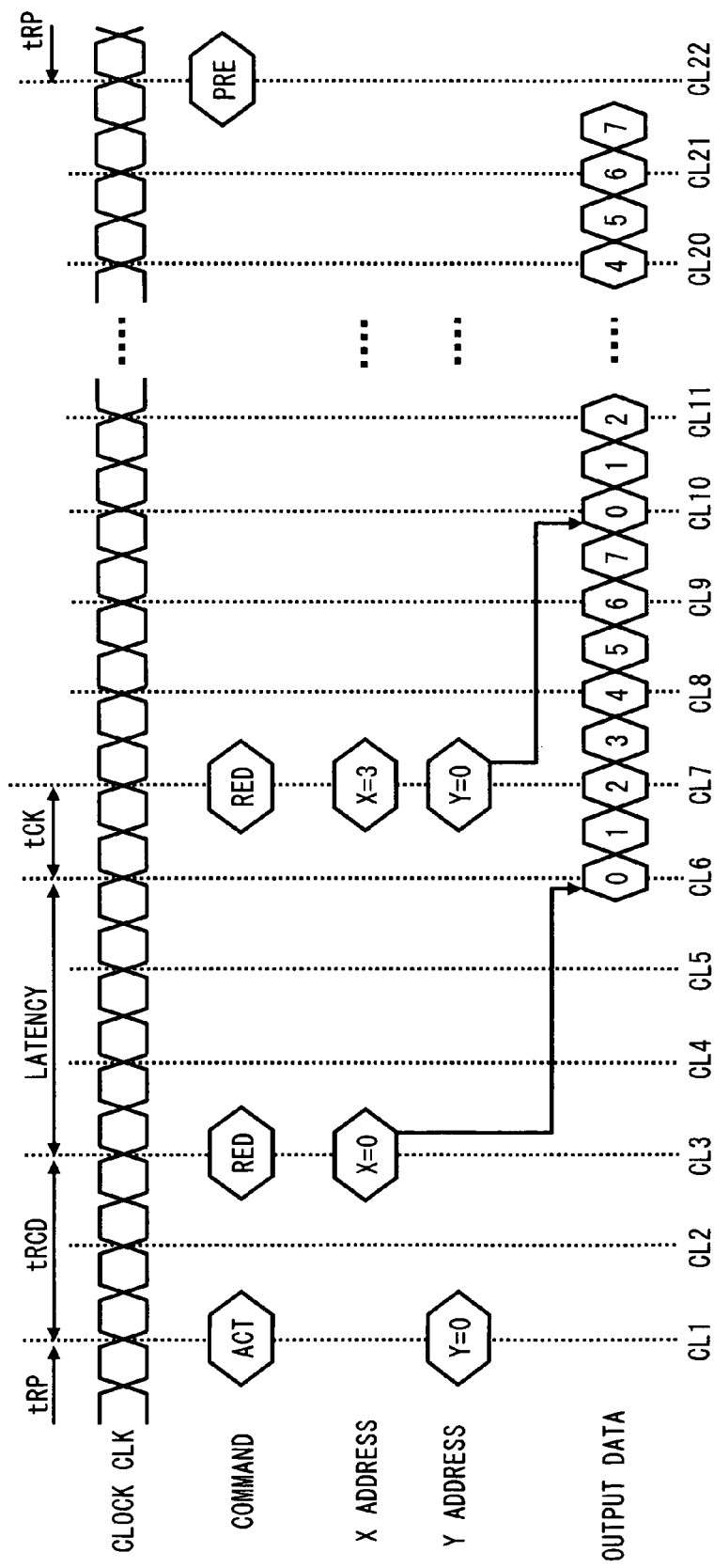
FIG. 14 is a timing chart showing an operation of the semiconductor memory device according to Embodiment 1.

An image of FIG. 13 shows straight lines each represented by eight pixels located in the Y-axis direction. The straight lines have X addresses specified by of X addresses of 0, 3, 5, and 7, respectively. FIG. 14 is a timing chart showing a case where 32 pieces of data representing a plurality of lines are read. In this example, it is assumed that the semiconductor memory device 1 performs the burst operation. The burst operation is an operation in which the Y address, which is input when the RAS signal is input, is used as a head address, to thereby generate Y addresses subsequent to the head address by the burst counter provided in the semiconductor memory device 1. In the semiconductor memory device 1 of this example, the use of an inverted clock signal enables obtainment of a data output speed twice as high as that obtained when the semiconductor memory device 1 operates based on a single-phase clock signal. Such a data output method is referred to as double data rate.

As shown in FIG. 14, upon input of the RAS signal at the timing of the first clock CL1, the semiconductor memory device 1 receives the operation start command ACT. In this case, the Y address used as the cell array row address CAX is also input simultaneously. Then, the semiconductor memory device 1 receives the CAS signal at the timing of the third clock CL3, and also receives the read command RED. At this time, the X address used as a part of the cell array column address CAY is input. Then, the data Q0 is output after elapse of time determined by the latency. The data Q0 is data represented by a coordinate (Y=0, X=0) which is specified by the Y address input in synchronization with the first clock CL1 and by the X address input in synchronization with the third clock CL3.

The semiconductor memory device 1 sequentially reads eight pieces of data by the burst operation without inputting the individual X addresses and Y addresses. In a case of sequentially performing a plurality of burst operations, the head address to be read as appropriate is input using the CAS signal. In this example, 21 clocks are required during a period from the time when the RAS signal is input to the semiconductor memory device 1 to the time when reading of all the data is completed. In the semiconductor memory device 1, information on the pixels in the image space is stored in the memory cells activated by a single word line. Accordingly, the RAS signal is not input until all the data are read. Further, the precharge operation is performed after all the data are read, and the preparation for reading image data in another image space is made.

Figure 16:
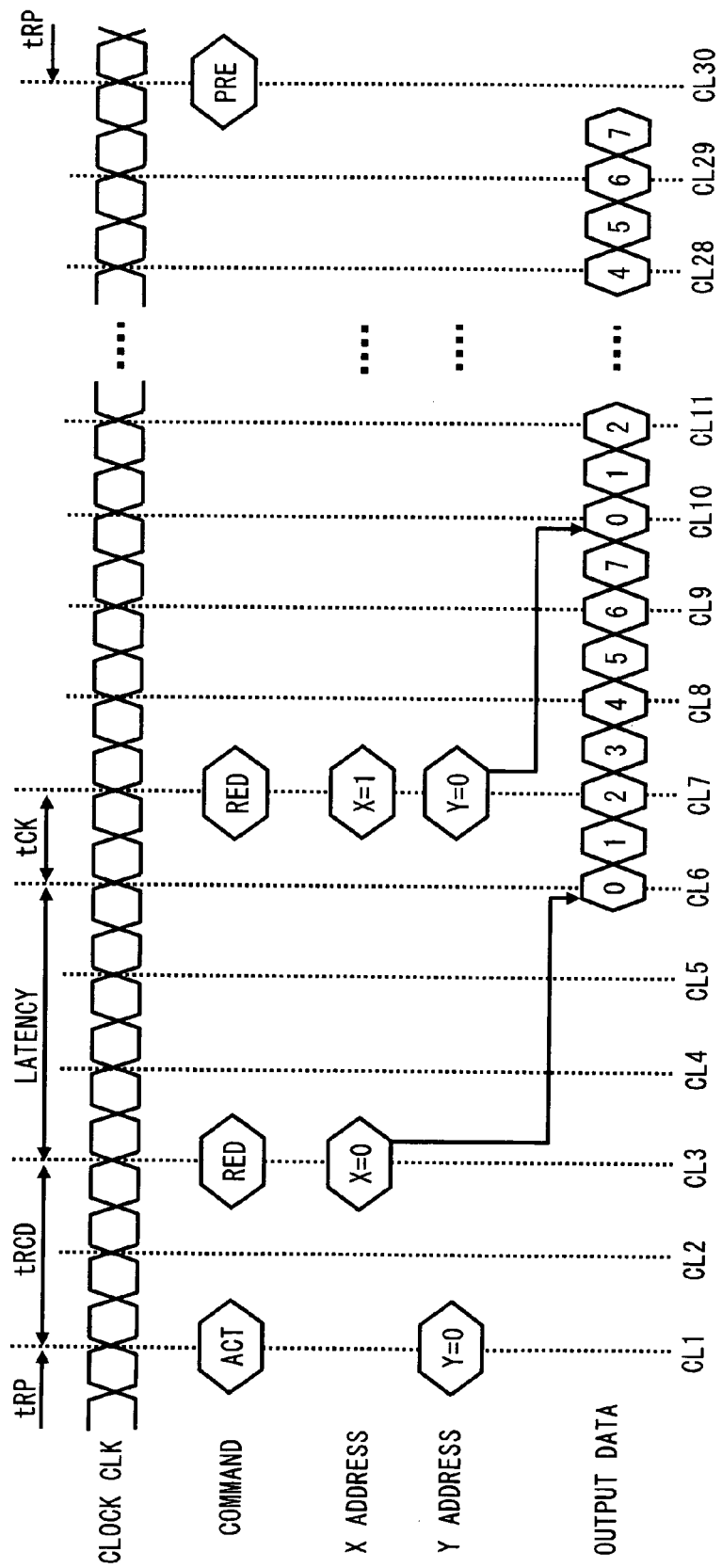
FIG. 16 is a timing chart showing an operation of the semiconductor memory device according to Embodiment 1.

An image shown in FIG. 15 is an image having eight pixel areas in the Y-axis direction and six pixel areas in the X-axis direction. FIG. 16 is a timing chart showing a case where 48 pieces of data corresponding to the areas are read. Also in this case, the pixels can be read by the burst operation in the same manner as in the example shown in FIG. 13. Also in this example, data is read according to the double data rate.

As shown in FIG. 16, upon input of the RAS signal at the timing of the first clock CL1, the semiconductor memory device 1 receives the operation start command ACT. In this case, the Y address used as the cell array row address CAX is also input simultaneously. Then, the semiconductor memory device 1 receives the CAS signal at the timing of the third clock CL3, and also receives the read command RED. At this time, the X address used as a part of the cell array column address CAY is input. Then, the data Q0 is output after elapse of time determined by the latency. The data Q0 is data represented by a coordinate (Y=0, X=0) which is specified by the Y address input in synchronization with the first clock CL1 and by the X address input in synchronization with the third clock CL3.

The semiconductor memory device 1 sequentially reads eight pieces of data by the burst operation without inputting the individual X addresses and Y addresses. In a case of sequentially performing a plurality of burst operations, the head address to be read as appropriate is input using the CAS signal. In this example, 29 clocks are required during a period from the time when the RAS signal is input to the semiconductor memory device 1 to the time when reading of all the data is completed. In the semiconductor memory device 1, information on the pixels in the image space is stored in the memory cells activated by a single word line. Accordingly, the RAS signal is not input until all the data are read. Further, the precharge operation is performed after all the data are read, and the preparation for reading image data in another image space is made.

As described above, in the semiconductor memory device 1 according to Embodiment 1, the address conversion circuit 15 generates the cell array column address by converting image data defining a two-dimensional space into one-dimensional information. Further, the address conversion circuit 15 generates a single cell array row address for each image space. As a result, data for a single image space can be stored in the memory cells connected to a single word line. In other words, the semiconductor memory device 1 enables access to the image data, which is stored in the cell array 17 and defines a two-dimensional space, only by activating a single word line. Therefore, in the semiconductor memory device 1, the number of word lines to be activated can be reduced, which leads to the reduction in power consumption required for the data access.

The X address and the Y address in the image space correspond to the word line address and the bit line address, respectively. In a case of accessing data having different X addresses, it is necessary to perform the precharge operation for each access to the different X addresses. In the typical DRAM, data defining a two-dimensional space is stored using a plurality of word lines, so it is necessary to perform a plurality of precharge operations. On the other hand, the semiconductor memory device 1 according to Embodiment 1 enables arbitrary access to data having different X addresses by performing the precharge operation only once. For this reason, in the semiconductor memory device 1, the power consumption required for the precharge operation can be reduced.

Further, in a case of accessing the data having different X addresses in the typical DRAM, it is necessary to execute the input of the RAS signal, the input of the CAS signal, and the precharge operation a plurality of times. On the other hand, the semiconductor memory device 1 according to Embodiment 1 enables arbitrary access to data having different X addresses by executing the input of the RAS signal, the input of the CAS signal, and the precharge operation only once. In other words, in the semiconductor memory device 1, the time required for the input of the RAS signal, the input of the CAS signal, and the precharge operation, which are executed irrespective of the number of data to be accessed, can be reduced as compared with the typical DRAM. FIG. 17 shows an example of comparison between operation times in the typical DRAM and those in the semiconductor memory device 1 according to Embodiment 1.

In FIG. 17, it is assumed that the time determined by tRCD is represented by "a", the time determined by latency is represented by "b", one cycle tCK of the clock signal is represented by "c", and the time determined by tRP is represented by "d". When the data having an image size of (2×2) is accessed, for example, in the typical DRAM, a processing time is represented by 2(a+b+2c+d). On the other hand, in the semiconductor memory device 1, a processing time is represented by a+b+4c+d. In this case, items related to "c", which depend on the number of data to be read, are the same between the typical DRAM and the semiconductor memory device 1. Accordingly, the comparison is made as to the time excluding the time associated with the items related to "c". Regarding a ratio of the processing time between the typical DRAM and the semiconductor memory device 1, when the processing time of the typical DRAM is assumed to be 100%, the semiconductor memory device 1 is capable of completing an operation with 50% of the processing time. As the number of pixels in the X-axis direction of the image to be read increases, a difference in ratio of the processing times becomes larger. That is, the semiconductor memory device 1 according to Embodiment 1 enables higher speed data processing as compared with the typical DRAM. As the size of the image to be handled increases, the effect of the high speed operation of the semiconductor memory device 1 becomes larger.

The semiconductor memory device 1 according to Embodiment 1 includes a plurality of image mapping circuits 15a to 15d corresponding to each size of the images to be handled by the address conversion circuit 15. The image mapping circuits 15a to 15d are capable of performing address conversion according to the predefined conversion rule, without the need of arithmetic processing. In other words, in the semiconductor memory device 1, even when the address conversion is executed, the power consumption due to the arithmetic processing does not increase. Therefore, in the semiconductor memory device 1, the power consumption due to the execution of the address conversion can be prevented from increasing.

Further, in the semiconductor memory device 1 according to Embodiment 1, the address conversion circuit performs address conversion according to the predetermined conversion rule. Accordingly, a correspondence between an address before conversion and an address after conversion is determined irrespective of the address of the data. Specifically, the data stored in the semiconductor memory device 1 holds coordinate information specified by an external device. As a result, the external device can access the data stored in the semiconductor memory device 1 without the need of converting the coordinate information of the data.

Embodiment 2

Embodiment 1 shows the example in which the image data defining the two-dimensional space is handled. In Embodiment 2 of the present invention, a description is given of an example in which image data defining a three-dimensional space is handled. In this case, as coordinate information indicating the three-dimensional space, an X-axis (X address), a Y-axis (Y address), and a Z-axis (Z address) are used. In Embodiment 2, the address conversion circuit 15 generates the cell array column address CAY with a combination of the X address, the Y address, and the Z address. Note that the Z address is handled as a bank address BA for specifying a bank of a cell array, for example, in the semiconductor memory device 1. Specifically, when the Z address is input to the semiconductor memory device 1, the bank address BA corresponding to the Z address is output by the address control circuit 14.

Figure 19:
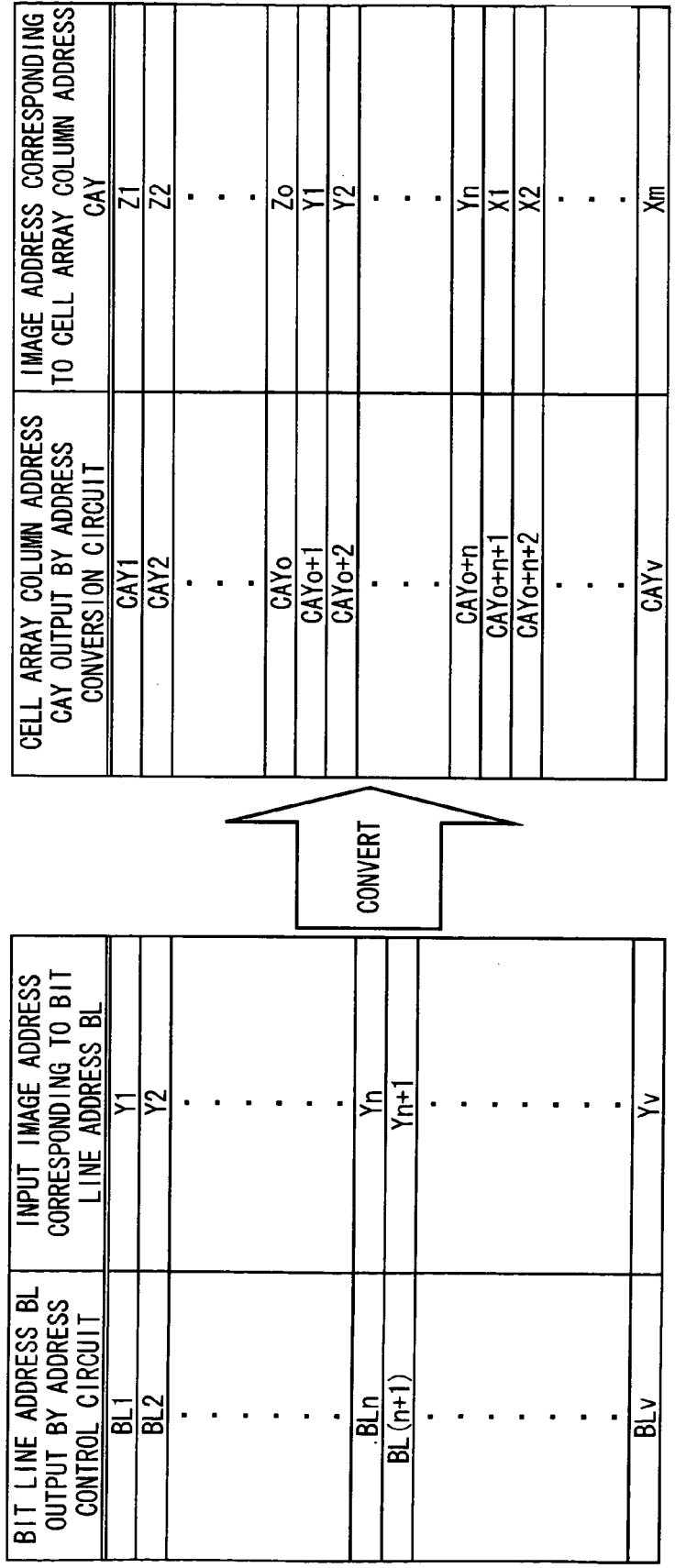
FIG. 19 is a diagram showing a conversion rule for address conversion performed in a case where the address conversion circuit according to Embodiment 2 generates a cell array column address.

Examples of an address conversion rule according to Embodiment 2 are shown in FIGS. 18 and 19. FIG. 18 shows an example of the conversion rule for address conversion from the word line address WL output by the address control circuit 14 to the cell array row address CAX. In this example, an h-bit word line address WL is associated with an X address of an image. For example, a least significant bit WL1 of the word line address WL is associated with a least significant bit X1 of the X address. The X address is defined using m bits of the word line address WL. In this case, bits from an (m+1)-th bit to an h-th bit (most significant bit) of the word line address have common values as coordinate addresses of an image space to be handled.

The address conversion circuit 15 generates the cell array row address CAX based on address information output by the address control circuit 14. In this example, the address conversion circuit 15 generates the cell array row address CAX by using the word line address (for example, values of bits from (m+1)-th bit to h-th bit (most significant bit) of X address), which is not used as a value representing the image space, among the word line addresses WL. For example, the bits from the (m+1)-th bit to the most significant bit of the X address are associated with the bits of the cell array row address CAX from the least significant bit thereof. In addition, bit values of the cell array row address CAX, which are not associated with any of the bit values of the X address, can be arbitrarily set.

FIG. 19 shows an example of a conversion rule for address conversion from the word line address WL, the bit line address BL, and the bank address BA, which are output by the address control circuit 14, to the cell array column address CAY. In this example, a v-bit bit line address BL is associated with a Y address of an image. For example, the least significant bit BL1 of the bit line address BL is associated with the least significant bit Y1 of the Y address. Then, the Y address is defined using n bits of the bit line address BL. In this case, bits from the (n+1)-th bit to the v-th bit (most significant bit) of the bit line address have common values as coordinate addresses of the image in the image space to be handled.

The address conversion circuit 15 generates the cell array column address CAY based on address information output by the address control circuit 14. In this example, the address conversion circuit 15 generates the cell array column address CAY by using the word line address, the bit line address, and the bank address BA (for example, values of bits from least significant bit to m-th bit of X address, values of bits from least significant bit to n-th bit of Y address, and values of bits from least significant bit to o-th bit of bank address BA), which are used as values representing the image space, among the word line addresses WL, the bit line addresses BL, and the bank addresses BA. For example, as values of bits from the least significant bit to the o-th bit of the cell array column address CAY, values of bits from the least significant bit to the o-th bit of the z address are used. As values of bits from the (o+1)-th bit to the (o+n)-th bit of the cell array column address CAY, values of bits from the least significant bit to the n-th bit of the Y address are used. As values of bits from the (o+n+1)-th bit to the most significant bit of the cell array column address CAY, values of bits from the least significant bit to the m-th bit of the X address are used.

In other words, the address conversion circuit 15 generates a single cell array row address CAX by using bits of each of the X address, the Y address, and the Z address that have common values as space coordinates of an image to be handled. In addition, the address conversion circuit 15 generates the cell array column address CAY by using bits of each of the X address, the Y address, and the Z address that have different values as space coordinates of an image to be handled. As a result, an image having a three-dimensional space can be stored in memory cells specified by a single cell array row address CAX. Note that the cell array row address CAX may be generated by using any one of the X address, the Y address, and the Z address, or may be generated by using a combination of the X address, the Y address, and the Z address. Further, a correspondence relation between the bits of the cell array column address CAY and the bits of each of the X address, the Y address, and the Z address can be arbitrarily set depending on the situation.

Figure 20:
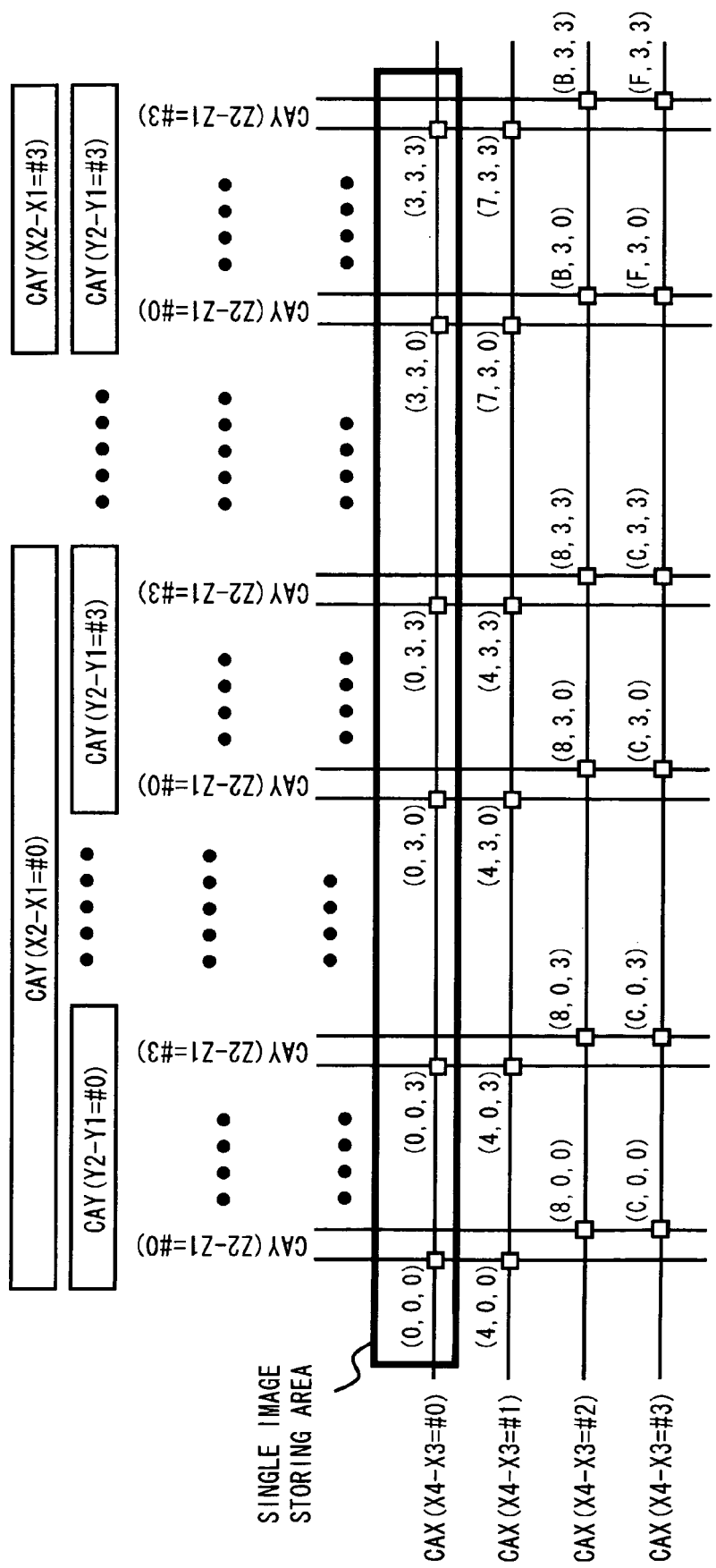
FIG. 20 is a diagram showing data storage positions in a cell array of a semiconductor memory device according to Embodiment 2.

Further, a description is given of a reading operation of the semiconductor memory device according to Embodiment 2. First, data storage positions in a cell array according to Embodiment 2 are shown in FIG. 20. As shown in FIG. 20, in Embodiment 2, a single piece of three-dimensional image data (for example, image data having image space of 4 pixels×4 pixels×4 pixels) is stored in memory cells connected to a single word line. In the following description, an operation executed when image data is read is described as an example. An example of the image to be read is shown in FIG. 21 and a timing chart showing the case of reading the image is shown in FIG. 22.

Figure 21:
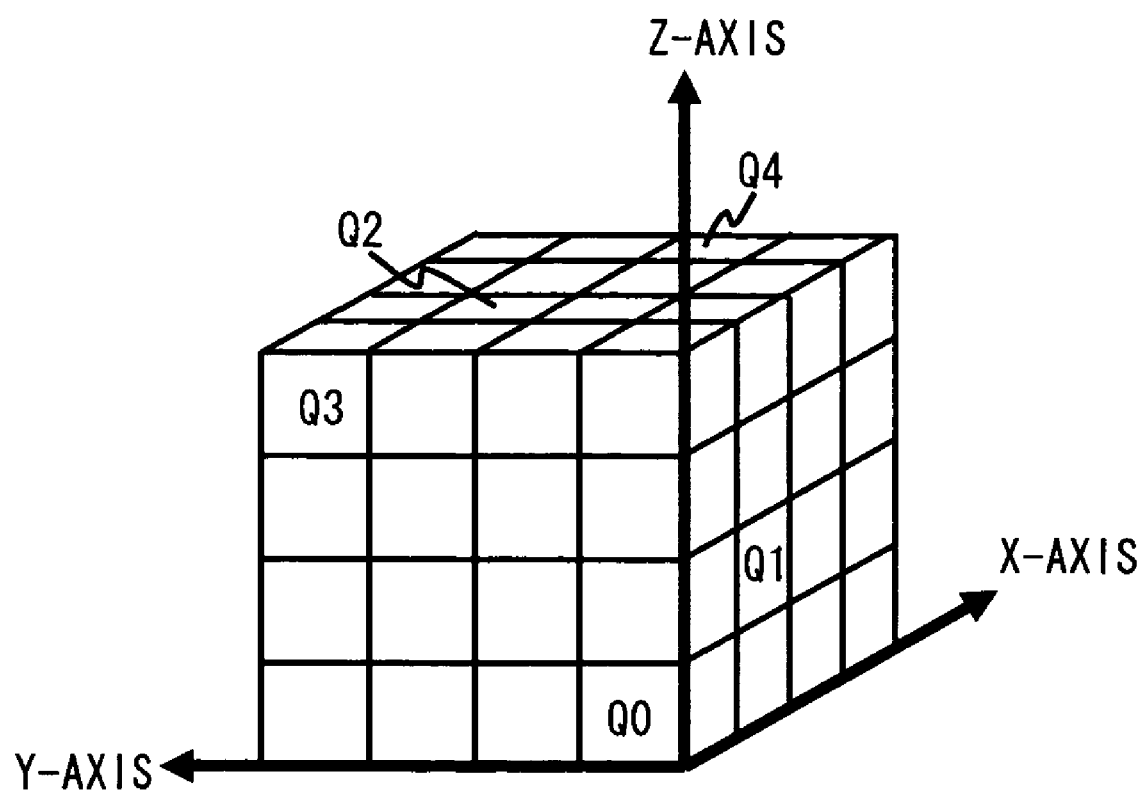
FIG. 21 is a diagram showing an image read by the semiconductor memory device according to Embodiment 2.
Figure 22:
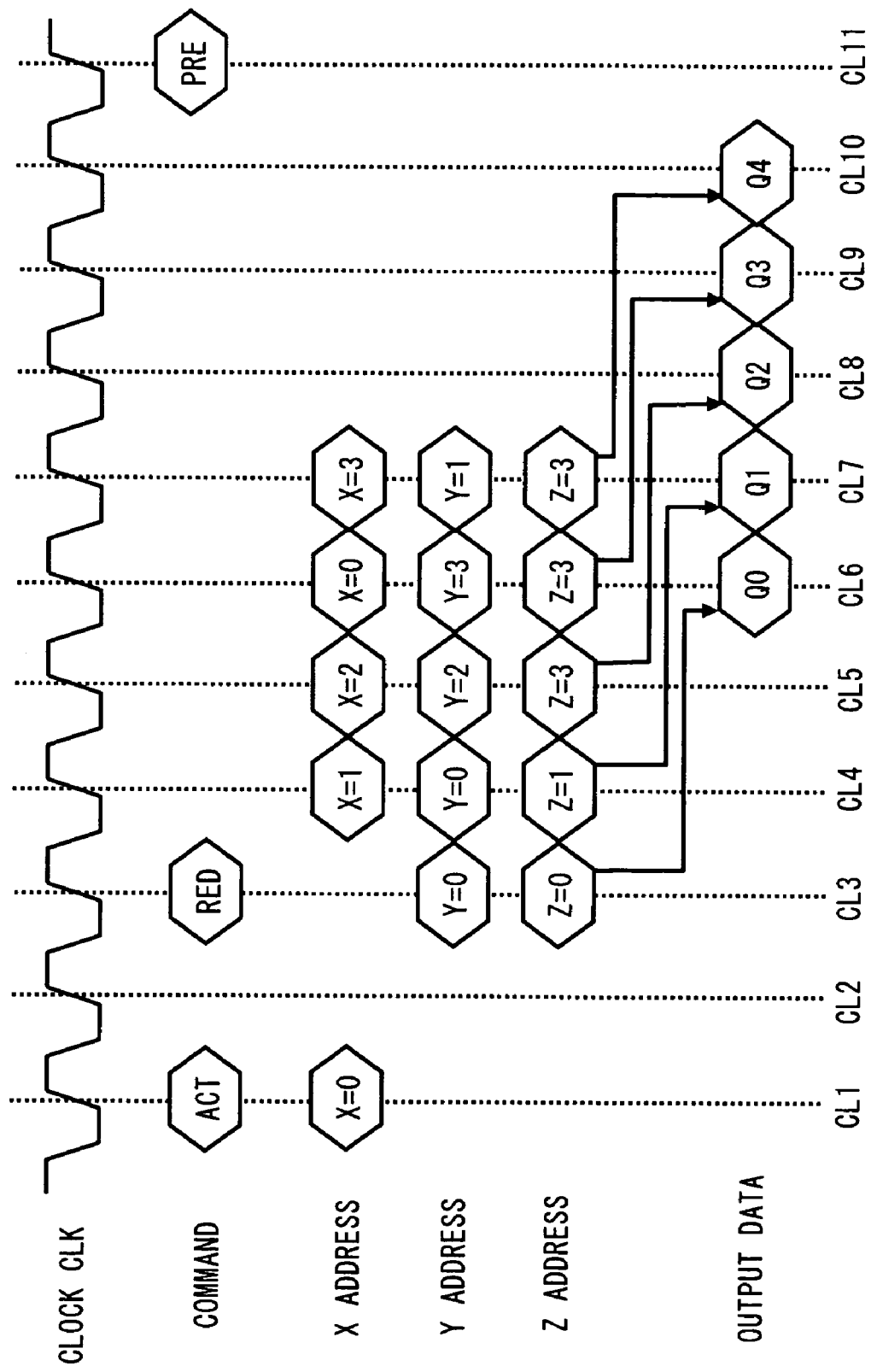
FIG. 22 is a timing chart showing an operation of the semiconductor memory device according to Embodiment 2.

The data to be read includes five pixels represented by Q0 to Q4 in FIG. 21. As shown in FIG. 22, upon input of the RAS signal at the timing of the first clock CL1, the semiconductor memory device 1 receives the operation start command ACT. In this case, the X address used as the cell array row address CAX is also input simultaneously. Then, the semiconductor memory device 1 receives the CAS signal at the timing of the third clock CL3, and also receives the read command RED. In this case, the Y address and the Z address that are used as a part of the cell array column address CAY are input. After elapse of time determined by the latency, the data Q0 is output. The data Q0 is data represented by a coordinate (Y=0, X=0, Z=0) which is specified by the X address input in synchronization with the first clock CL1 and by the Y address and the Z address that are input in synchronization with the third clock CL3.

In the semiconductor memory device 1, X addresses and Y addresses are sequentially input in synchronization with clocks after the third clock CL3, to thereby read five pieces of data. In this example, 10 clocks are required during a period from the time when the RAS signal is input to the semiconductor memory device 1 to the time when reading of all the data is completed. In the semiconductor memory device 1, information on the pixels in the image space is stored in memory cells activated by a single word line. Accordingly, the RAS signal and the CAS signal are not input until all the data are read. Further, the precharge operation is performed after all the data are read, and the preparation for reading image data in another image space is made.

As described above, the semiconductor memory device 1 is capable of handling not only two-dimensional data but also three-dimensional data by associating the rule for the address conversion executed by the address conversion circuit 15 with three-dimensional data.

Embodiment 3

In Embodiments 1 and 2, the number of banks to be accessed is one. When the semiconductor memory device 1 includes a plurality of banks, the plurality of banks can be accessed in parallel by bank interleave control. The bank interleave control refers to control performed in the semiconductor memory device including a plurality of banks. In the bank interleave control, word lines of each bank can be individually activated. In addition, data can be read in parallel from memory cells connected to the word lines activated in each bank. By employment of the bank interleave control, when a value of a single pixel is represented by 4 bits, for example, values of the bits can be divided into a plurality of banks to be stored.

Embodiment 4

In Embodiment 4 of the present invention, Z addresses are not used as addresses indicating space coordinates, but are used as terminal addresses indicating numbers of data input/output terminals (hereinafter, abbreviated as "I/O terminal"). In a semiconductor memory device, the number of I/O terminals is generally determined in advance, and it is impossible to change the number of I/O terminals after the production of the semiconductor memory device. In this situation, when data having a bit width larger than the actual number of I/O terminals is handled, it is necessary to use another semiconductor memory device or to redesign the semiconductor memory device.

In view of this, in Embodiment 4, the Z addresses are associated with the numbers of the I/O terminal. For example, in a semiconductor memory device having 16 I/O terminals, when data having a bit width of 64 bits is handled, 0th to 15th I/O terminals are assigned to Z addresses represented by 0, 16th to 31st I/O terminals are assigned to Z addresses represented by 1, 32nd to 47th I/O terminals are assigned to Z addresses represented by 2, and 48th to 63rd I/O terminals are assigned to Z addresses represented by 3. In addition, the data having the bit width of 64 bits is divided into data having a bit width of 16 bits. Then, the Z addresses are added as addresses of data in the order of data to be input/output.

Figure 23:
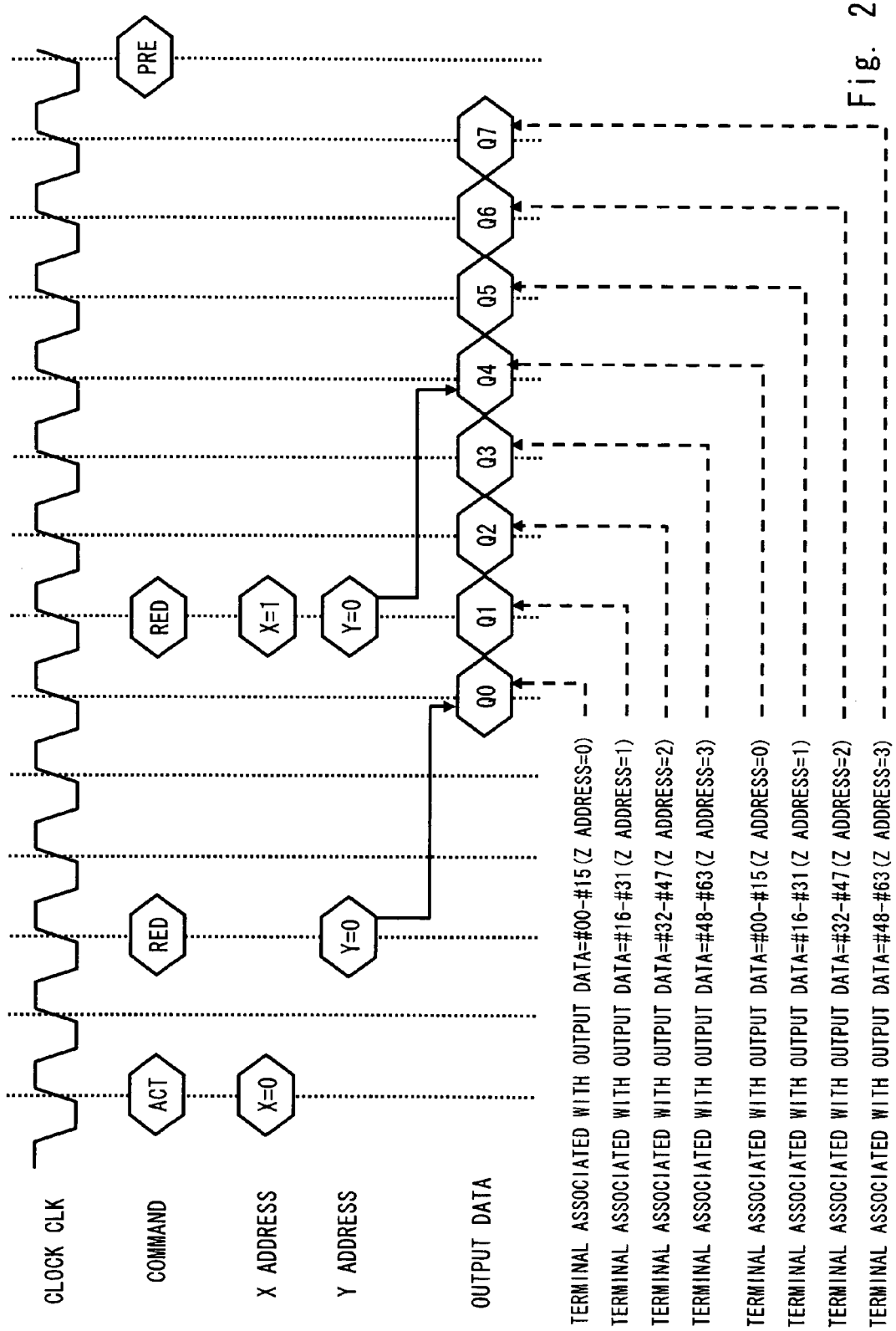
FIG. 23 is a timing chart showing an operation of a semiconductor memory device according to Embodiment 4 of the present invention.

FIG. 23 is a timing chart showing a data output operation of the semiconductor memory device 1 in a case where the Z addresses are used in the above-mentioned manner. Note that, in this example, the Z addresses are generated in the semiconductor memory device 1 according to the burst operation. As shown in FIG. 23, when the RAS signal and the CAS signal are input, the data Q0 is output. The data Q0 corresponds to data output through the 0th to 15th I/O terminals. Then, the data Q1 to Q3 are output. The data Q1 corresponds to data output through the 16th to 31st I/O terminals. The data Q2 corresponds to data output through the 32nd to 47th I/O terminals. The data Q3 corresponds to data output through the 48th to 63rd I/O terminals.

As described above, in the semiconductor memory device 1 according to Embodiment 4, the address conversion circuit 1 generates a cell array column address with a combination of the X address, the Y address, and the Z address.

Accordingly, even when the Z addresses are used as additional information corresponding to the numbers of I/O terminals through which data is input/output, the data can be stored in memory cells connected to a single word line. In other words, by using the Z addresses as additional information, the semiconductor memory device 1 is capable of handling various data with different bit widths, irrespective of the number of I/O terminals. Since the Z addresses are generated in the semiconductor memory device 1, an external device can manage data by using only X addresses and Y addresses also in this case.

Embodiment 5

In Embodiment 5 of the present invention, when a value of a single pixel is represented by a plurality of bits, Z addresses are used as data addresses to be associated with positions of the bits representing the value of the pixel. For example, when output data is represented by 4 bits, the least significant bit of the output data is assigned to a Z address represented by 0, the second lowest-order bit of the output data is assigned to a Z address represented by 1, the third lowest-order bit of the output data is assigned to a Z address represented by 2, and the most significant bit of the output data is assigned to a Z address represented by 3.

Note that, in Embodiment 5, the Z addresses are generated in the semiconductor memory device 1 according to the burst operation. The address conversion circuit 15 generates the cell array column address CAY with a combination of the X address, the Y address, and the Z address.

Figure 24:
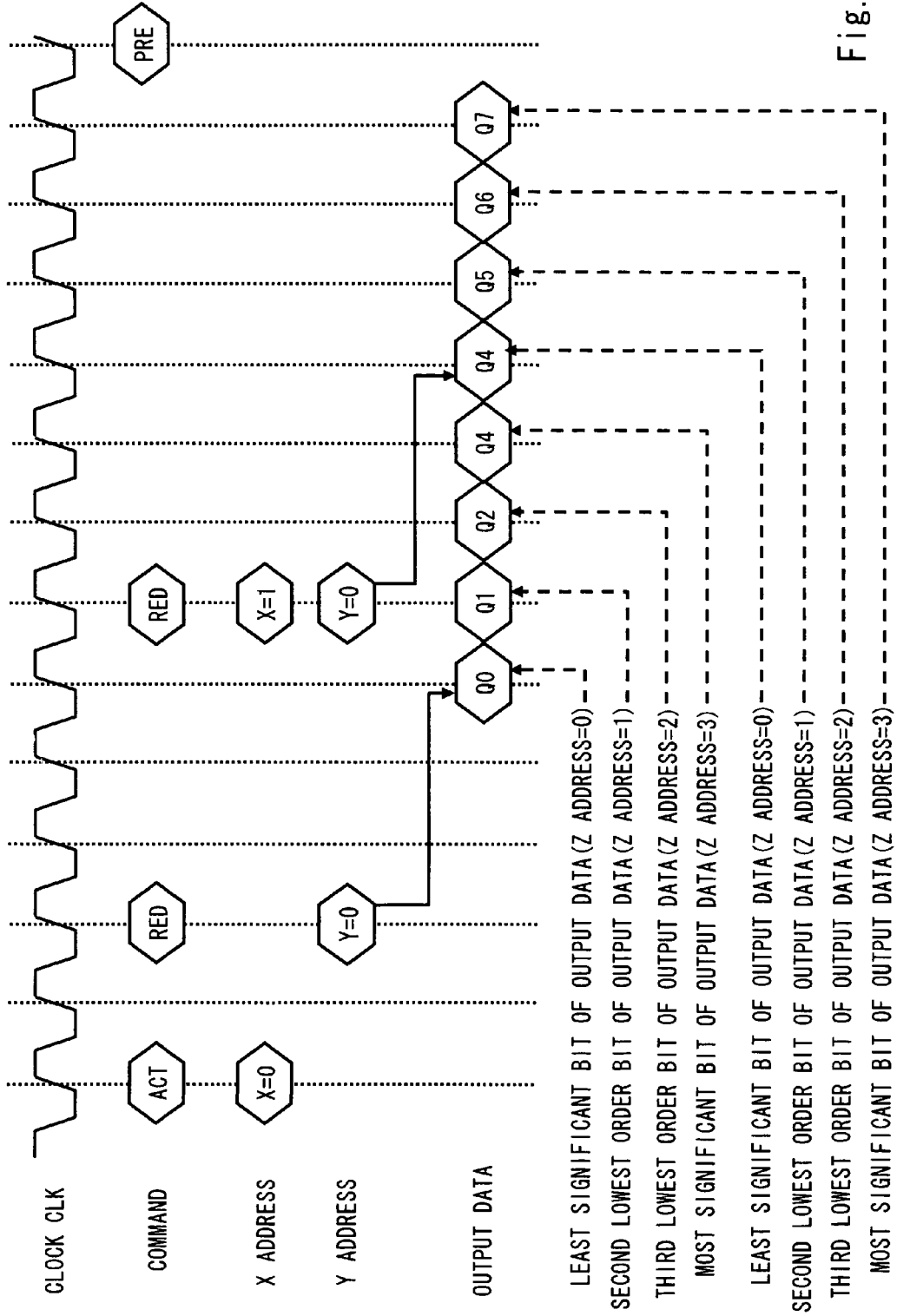
FIG. 24 is a timing chart (during serial operation) showing an operation of a semiconductor memory device according to Embodiment 5 of the present invention.

FIG. 24 is a timing chart showing an operation of the semiconductor memory device 1 according to Embodiment 5. As shown in FIG. 24, in Embodiment 5, when the address of data, which is read based on the X address and the Y address, is specified, four pieces of data, that is, data Q0 to Q3 are output thereafter. In this case, the data Q0 to Q3 are sequentially output according to the burst operation. Further, the data Q0 to Q3 correspond to bits of 4-bit data.

As described above, in the semiconductor memory device 1 according to Embodiment 5, each bit of the data represented by a plurality of bits is associated with each Z address, whereby the data formed of a plurality of bits is stored in memory cells connected to a single word line. In this case, since Z addresses are generated in the semiconductor memory device 1, an external device can manage the data by using only X addresses and Y addresses.

Figure 25:
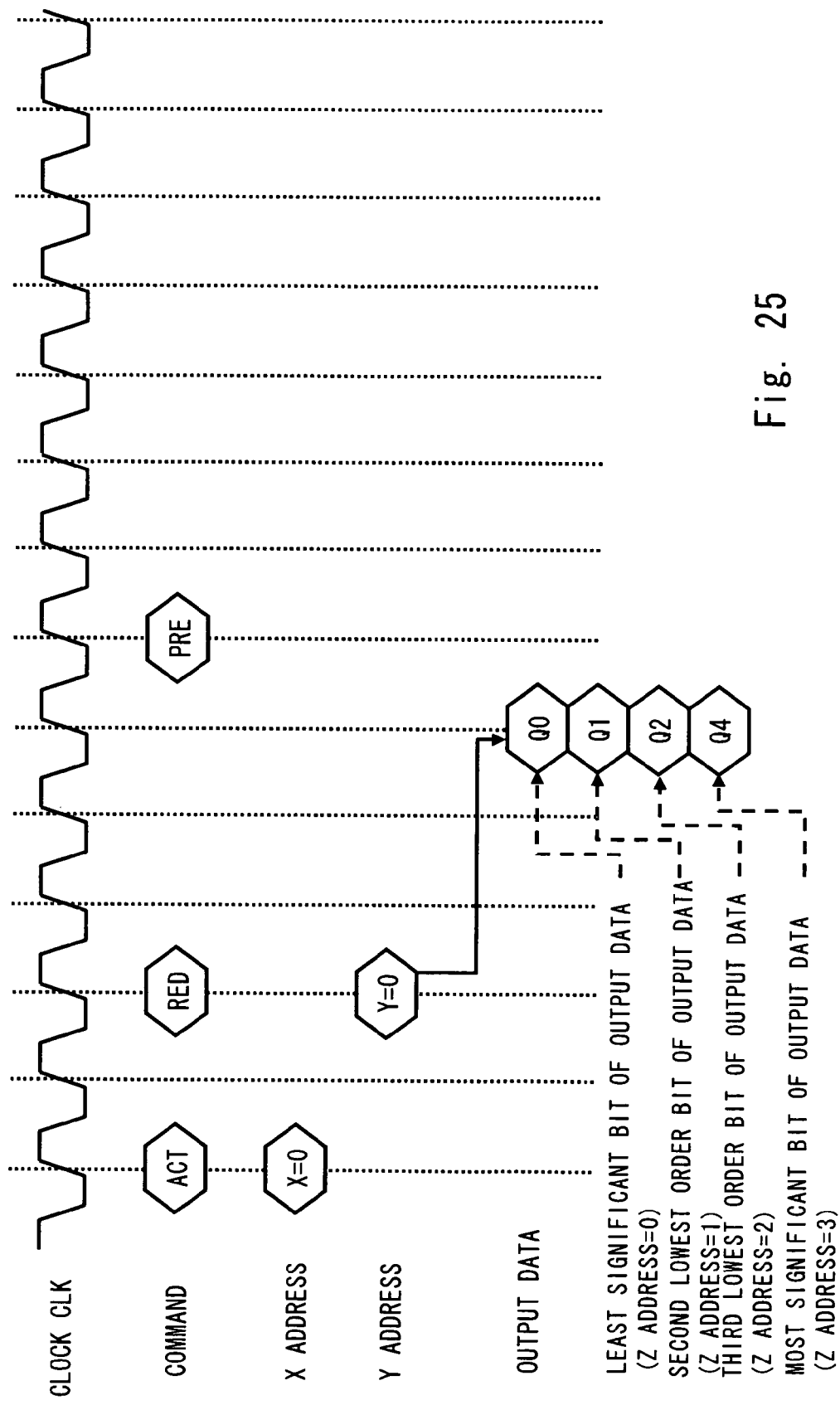
FIG. 25 is a timing chart (during parallel operation) showing an operation of the semiconductor memory device according to Embodiment 5.

Note that, in the above embodiments, the semiconductor memory device 1 sequentially outputs data according to a serial operation. Alternatively, the semiconductor memory device 1 can output data according to a parallel operation for outputting data in parallel by use of a plurality of I/O terminals. FIG. 25 is a timing chart showing an operation of the semiconductor memory device 1 for performing the parallel operation. As shown in FIG. 25, in the parallel operation, after the CAS signal is input, four pieces of data are simultaneously output in synchronization with a single clock.

Embodiment 6

In Embodiment 6 of the present invention, when a single image space is divided into a plurality of small spaces, Z addresses are used as small space addresses representing the small spaces. In the semiconductor memory device 1, a cell array row address CAX and a cell array column address CAY are formed of a plurality of bits. Accordingly, the number of word lines and the number of bit line pairs is represented by the power of 2. On the other hand, the number of pixels in the X-axis direction and the number of pixels in the Y-axis direction in a single image space are not necessarily represented by the power of 2. As a result, the use efficiency of the memory cells in the cell array 17 may be deteriorated.

Figure 26:
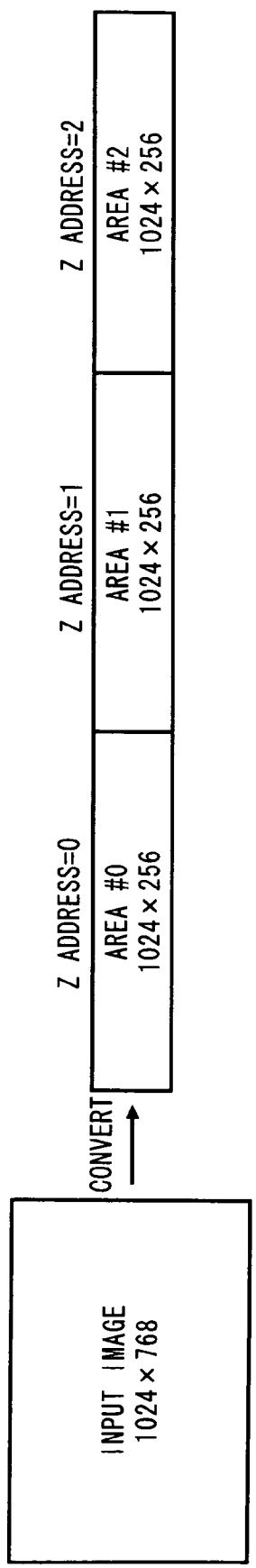
FIG. 26 is a diagram showing a method of converting an image to be handled in Embodiment 6 of the present invention.

In view of this, in Embodiment 6, a single image space is handled as a set of small spaces (for example, small images) with the number of pixels defined by the power of 2. For example, in a case of an image having 1024 pixels in the X-axis direction and 768 pixels in the Y-axis direction, the image is divided into small images having 1024 pixels in the X-axis direction and 256 pixels in the Y-axis direction, whereby a single image is handled as a set of three small images. Then, the small images are each assigned with a Z address. A screen image obtained through such division is shown in FIG. 26.

Figure 27:
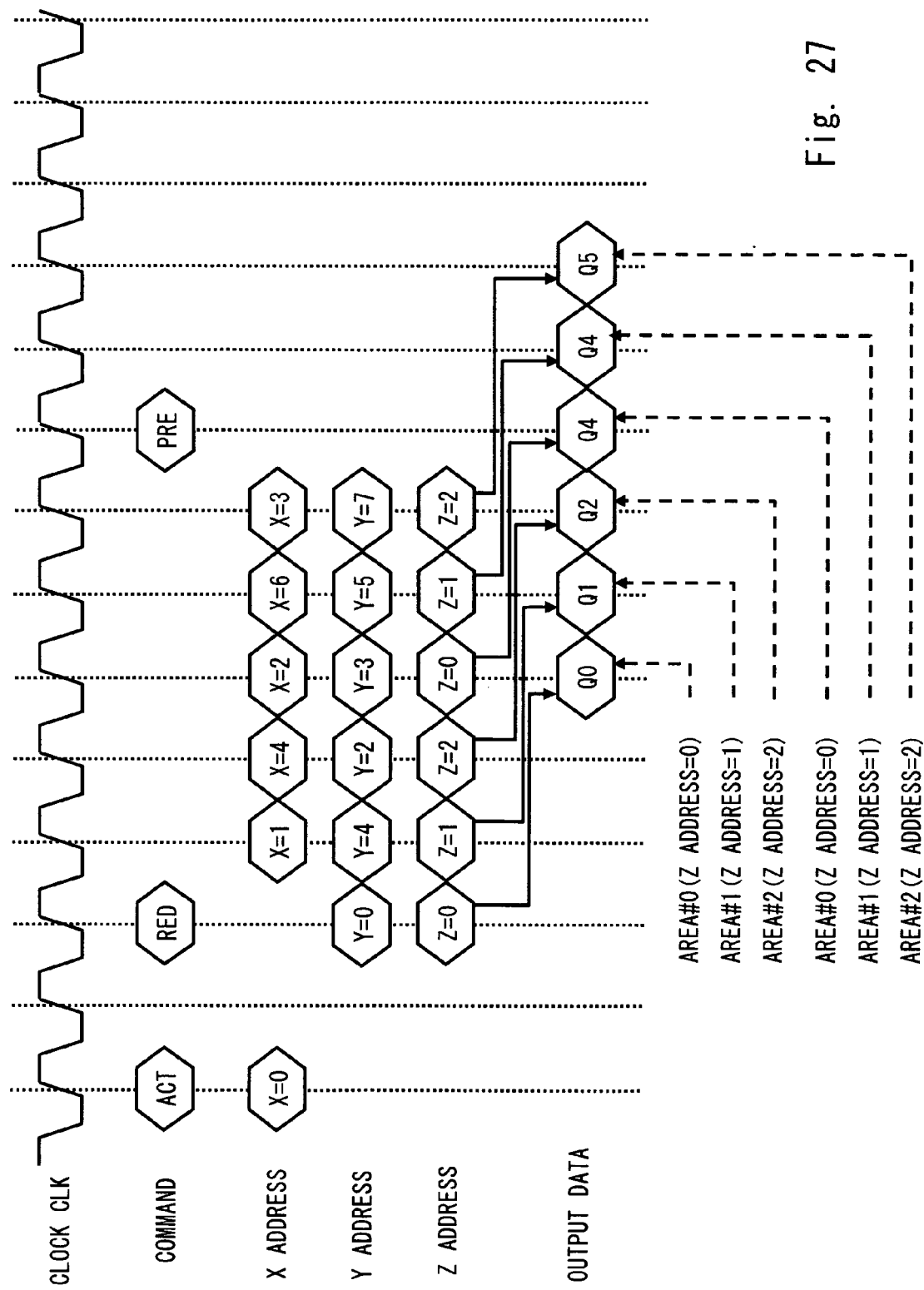
FIG. 27 is a timing chart showing an operation of a semiconductor memory device according to Embodiment 6.

FIG. 27 is a timing chart showing an operation of the semiconductor memory device 1 of this case. As shown in FIG. 27, pixels to be read are specified using the X address, the Y address, and the Z address, whereby data can be accessed also in Embodiment 6 in the same manner as in Embodiment 2. Note that the division of the image and the generation of the Z addresses assigned to the small spaces after the division can be performed also by the address conversion circuit 15.

As described above, in the semiconductor memory device 1 according to Embodiment 6, the image whose size is not defined by the power of 2 is also divided into small images each having the size represented by the power of 2. As a result, the use efficiency of the memory cells arranged in the cell array 17 can be enhanced. Further, when the conversion of the image size according to Embodiment 6 is performed by the address conversion circuit 15, it is unnecessary for the external device to perform any conversion.

Embodiment 7

The semiconductor memory device 1 of the present invention has the effect of reducing the power consumption as described above. In addition, when the semiconductor memory device 1 of the present invention is combined with a data processing device such as a CPU for reading and writing data according to a full page operation, an effect of particularly increasing a speed of a data reading/writing operation can be obtained. The full page operation refers to an operation for accessing a plurality of memory cells connected to a single word line after a pair of addresses (for example, combination of X address and Y address) are input. In a data transmission/reception method described in Embodiment 7 of the present invention, a data transmission/reception method for a CPU is changed depending on the data storage method for the semiconductor memory device 1 of the present invention, whereby the effect of increasing the speed of the data reading/writing operation can be enhanced.

FIG. 28 shows an example of an image to be handled in Embodiment 7. As shown in FIG. 28, the image has pixel data corresponding to data Q0 to QV in an upper half of the image having 8×8 pixels. When such an image is handled, in an operation performed in a typical SDRAM, an address (X=0, Y=0) is specified, and data Q0 to Q3, which are stored in memory cells connected to a word line specified by an X address represented by 0, are transmitted/received. Then, an address (X=1, Y=0) is specified, and data Q4 to Q7, which are stored in memory cells connected to a word line specified by an X address represented by 1, are transmitted/received. After that, the operations are sequentially repeated for addresses from an X address represented by 2 to an X address represented by 7.

Figure 29:
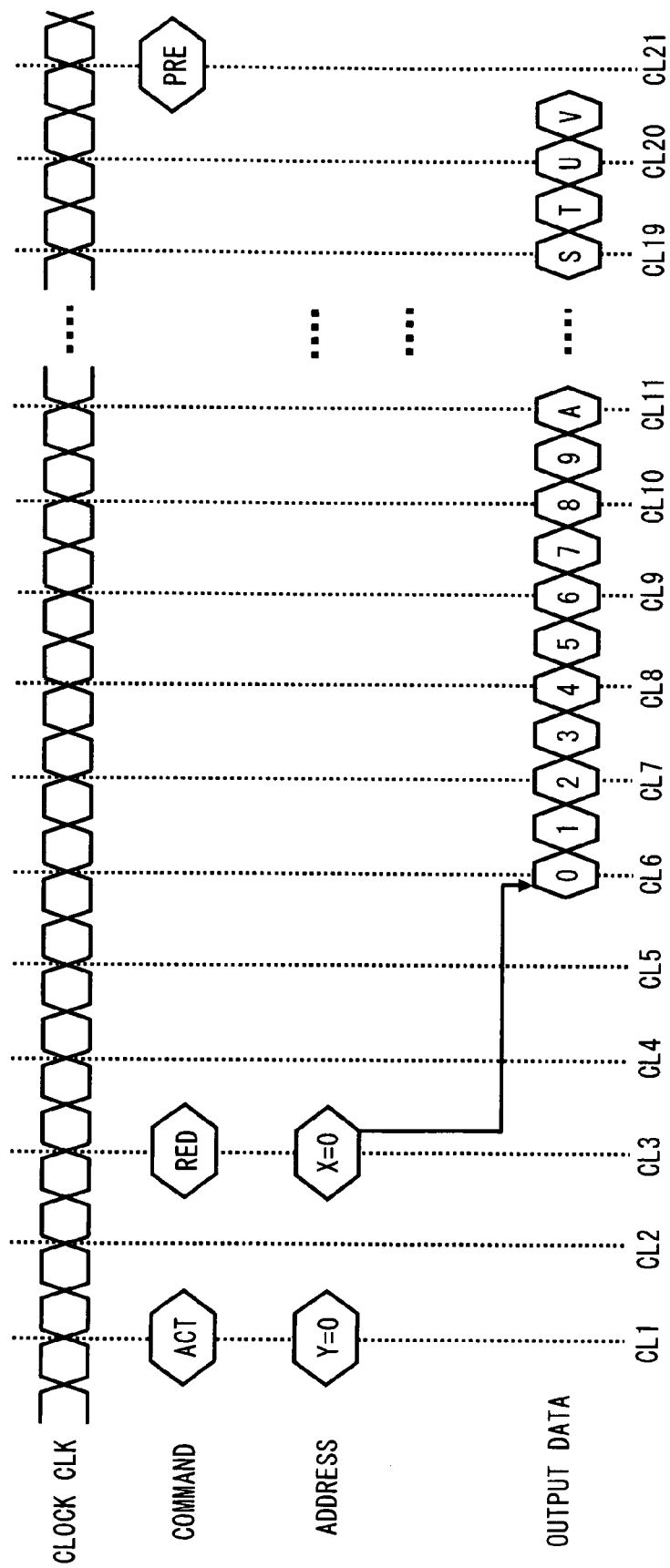
FIG. 29 is a timing chart showing a reading operation of the semiconductor memory device according to Embodiment 7.

On the other hand, in the full page operation illustrated in Embodiment 7, by adjusting the address conversion method, for example, an address (X=0, Y=0) is specified, and then, the data Q0 to QV can be sequentially read or written without the need of specifying the address again. FIG. 29 is a timing chart showing the reading operation according to Embodiment 7. As shown in FIG. 29, in the data transmission/reception method illustrated in Embodiment 7, the 0thY address as well as the operation start command ACT is specified at the timing of the clock CL1. Then, the 0th X address as well as the read command RED is specified at the timing of the clock CL3. In response to the input of the read command RED at the timing of the clock CL3, the data Q0 to QV are sequentially read at timings of clocks CL6 to CL20. The data Q0 to QV thus read are appropriately arranged in the CPU, whereby a target image is reproduced.

Figure 30:
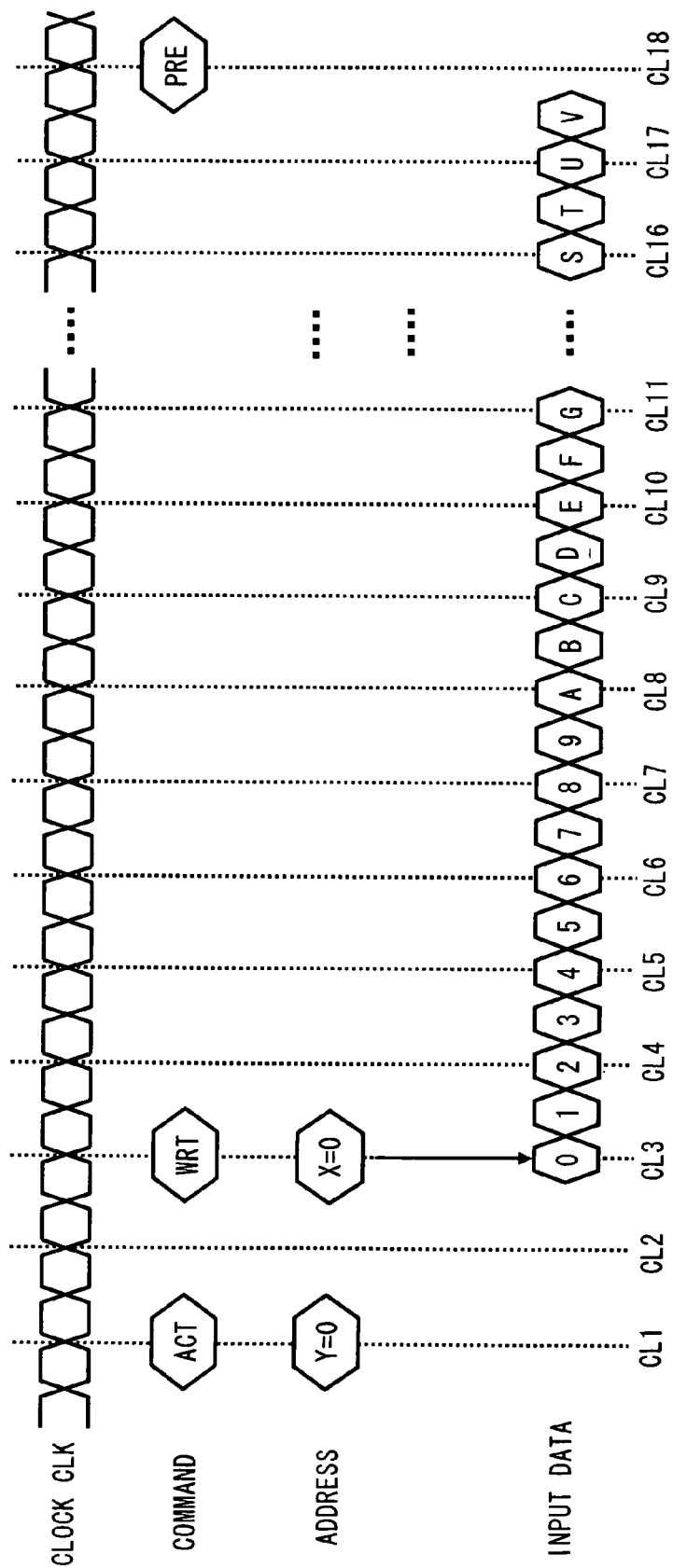
FIG. 30 is a timing chart showing a writing operation of the semiconductor memory device according to Embodiment 7.

On the other hand, FIG. 30 is a timing chart showing the writing operation according to Embodiment 7. As shown in FIG. 30, in the data transmission/reception method illustrated in Embodiment 7, the 0th Y address as well as the operation start command ACT is specified at the timing of the clock CL1. Then, at the timing of the clock CL3, the 0th X address as well as the write command WRT is specified and the data Q0 used as initial data is input. Then, the data Q0 to QV are sequentially input at timings of clocks CL3 to CL17. Thus, in Embodiment 7, by arranging the write data in a continuous form on a side of the CPU, target image data is written without the need of reinput of the address for each X address.

Figure 31:
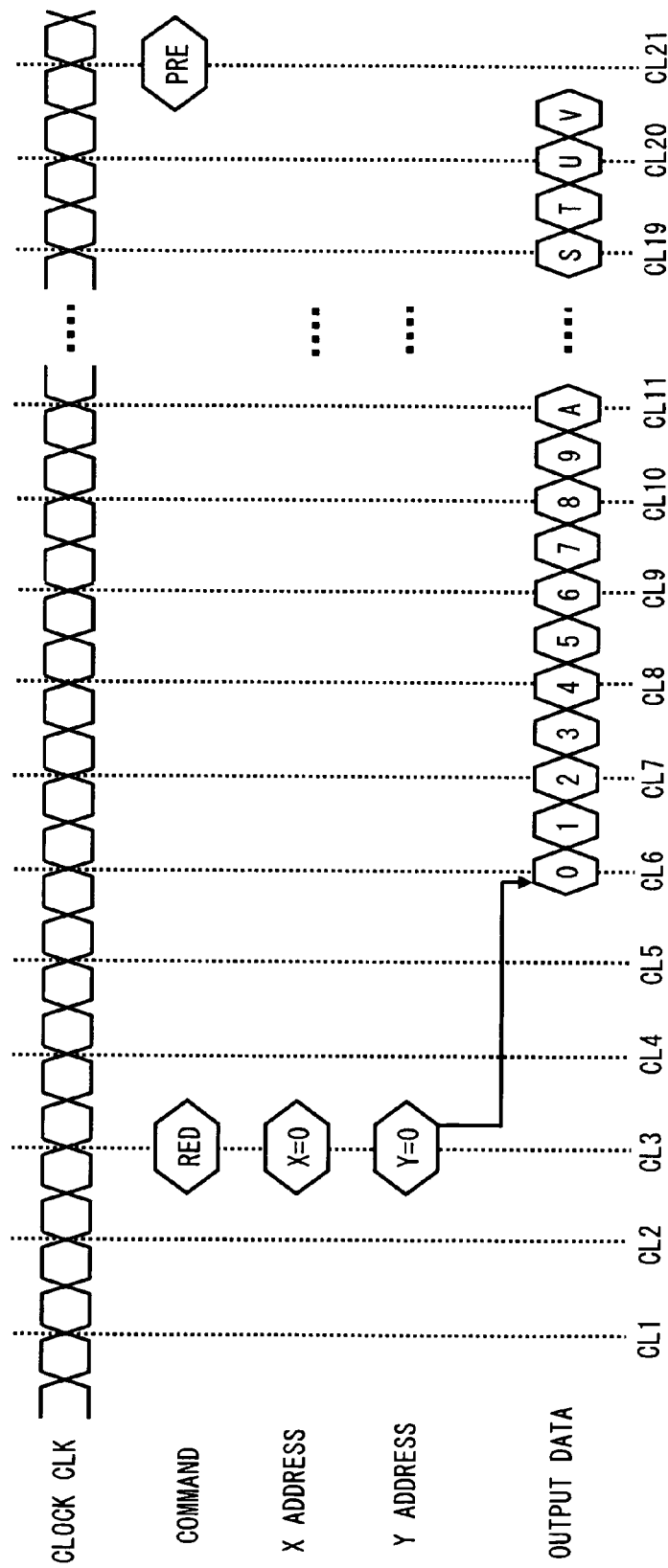
FIG. 31 is a timing chart showing another example of the reading operation of the semiconductor memory device according to Embodiment 7.
Figure 32:
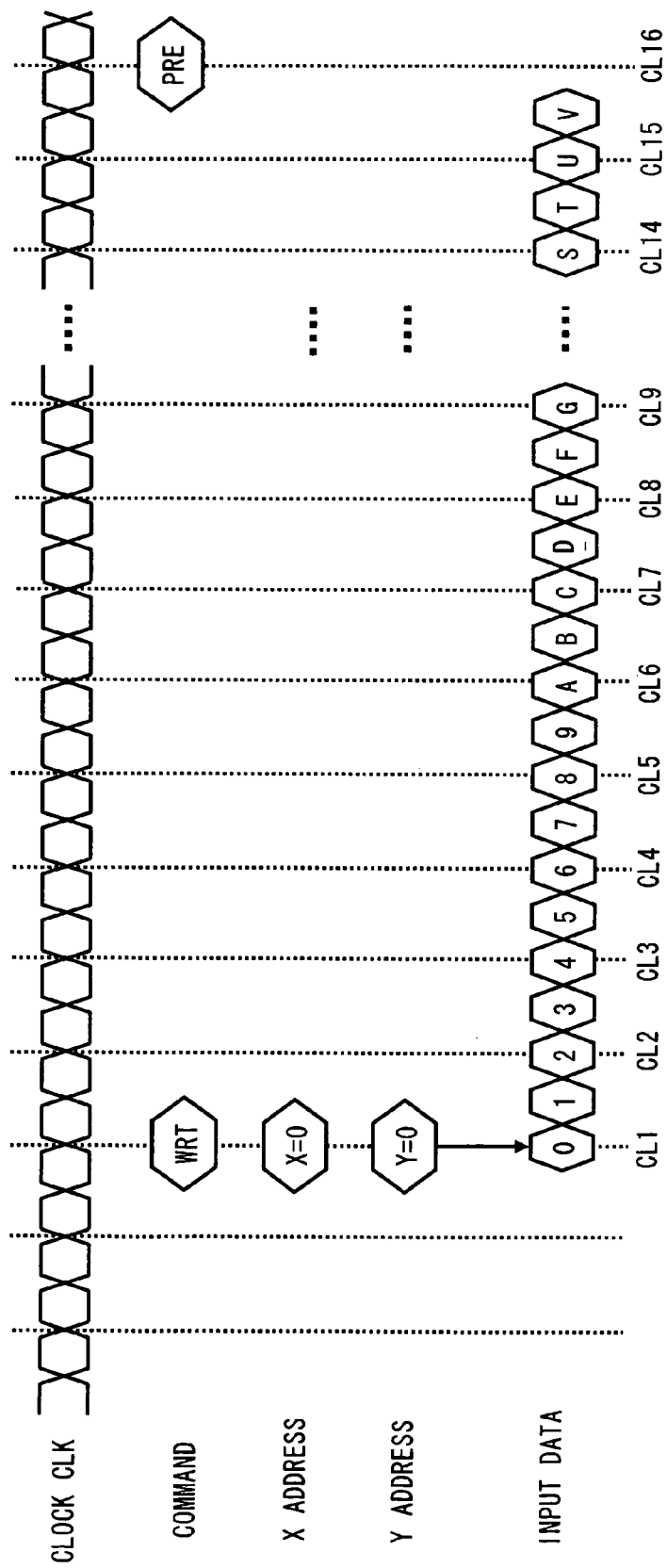
FIG. 32 is a timing chart showing another example of the writing operation of the semiconductor memory device according to Embodiment 7.

As another embodiment of the semiconductor memory device 1, a description is given of an operation performed in a case where a pseudo SRAM (RAM having SRAM interface and employing DRAM cells) is used. In the pseudo SRAM, it is prescribed in the specifications that an X address and a Y address are transmitted with a read command or a write command. Accordingly, operations shown in timing charts of FIGS. 31 and 32 correspond to the data reading operation and the data writing operation, respectively. FIG. 31 is a timing chart showing the reading operation of the pseudo SRAM. As shown in FIG. 31, in the pseudo SRAM, an X address and a Y address, as well as the read command RED, are input, and data is then read. FIG. 32 is a timing chart showing the writing operation of the pseudo SRAM. As shown in FIG. 32, in the pseudo SRAM, an X address, a Y address, and data Q0 used as head address, as well as the write command WRT, are input, and then, pieces of data are sequentially input.

In the semiconductor memory device 1 according to the present invention, multidimensional image data is stored in memory cells connected to a single word line. Accordingly, the data can be written according to the full page operation while the address information is held by employment of the address conversion method as in Embodiment 7. As a result, data for a single image can be read or written by executing the full page operation once, without the need of reinput of the address. Accordingly, in the semiconductor memory device 1 of the present invention, the time for the reinput of the address and command and the time for the precharge operation can be reduced, with the result that the memory can be accessed at higher speed.

Embodiment 8

Figure 33:
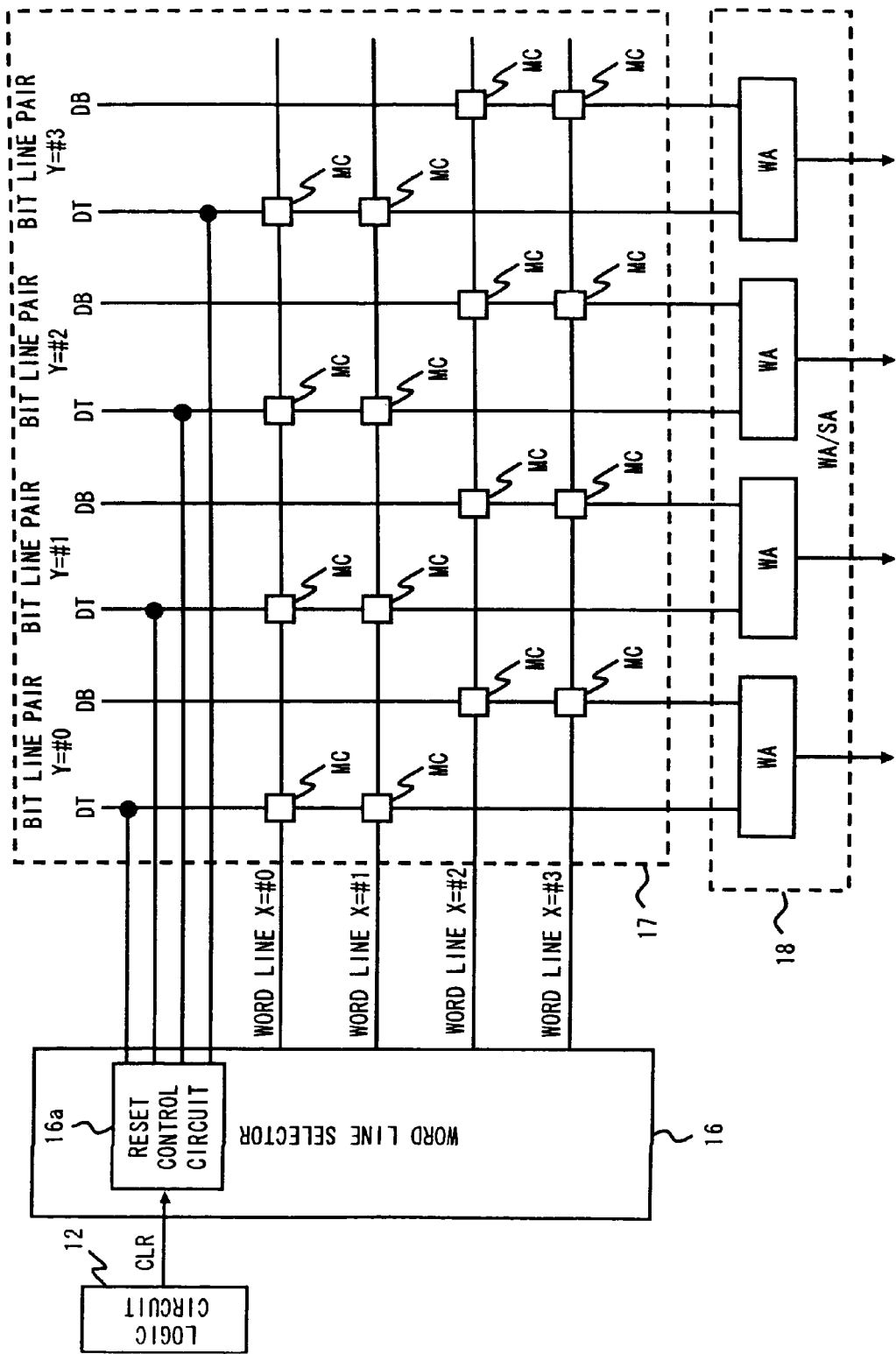
FIG. 33 is a block diagram showing a word line selector, a memory cell array, and write amplifiers/sense amplifiers of a semiconductor memory device according to Embodiment 8 of the present invention.

In Embodiment 8 of the present invention, a description is given of an example in which a resetting operation is performed once for memory cells in a cell array when data is written before a data writing operation is executed. FIG. 33 is a detailed block diagram showing the word line selector 16, the memory cell array 17, and the sense amplifier/write amplifier 18 according to Embodiment 8. Note that FIG. 33 shows the logic circuit 12 as a block for generating a clear signal CLR to be described later.

As shown in FIG. 33, the word line selector 16 includes a reset control circuit 16a in addition to a function of a word line selector for selectively driving word lines X. The reset control circuit 16a applies a reset potential (for example, ground potential) to bit lines DT of the cell array in response to the clear signal CLR output from the logic circuit 12, for example. The cell array 17 includes bit line pairs Y each including a bit line DT and a bit line DB, and memory cells MC each connected between one of the bit line DT and the bit line DB, and each word line X. The memory cells MC are memory elements for storing data. Note that, in FIG. 33, only four word lines X and four bit line pairs Y are illustrated for simplification of the illustration, but actually, much more word lines X and much more bit line pairs Y are provided. The sense amplifier/write amplifier 18 includes sense amplifiers SA and write amplifiers WA. In those circuits, the same circuits can be used in common. FIG. 33 illustrates only the write amplifiers WA involving an operation which is characteristic of Embodiment 7.

Figure 34:
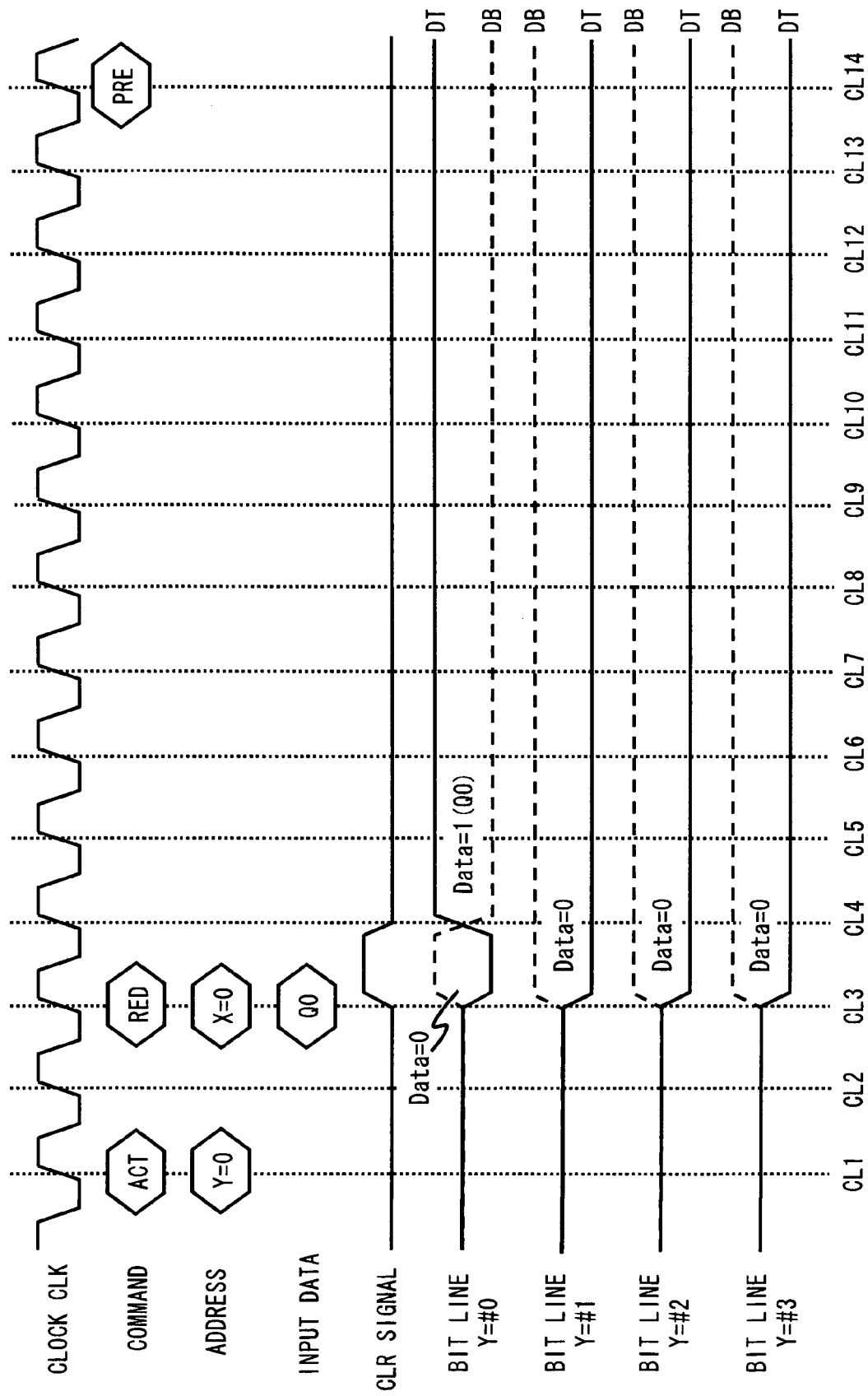
FIG. 34 is a timing chart showing a writing operation of the semiconductor memory device according to Embodiment 8.

In this case, a description is given of a data writing operation of the semiconductor memory device 1 according to Embodiment 8. FIG. 34 is a timing chart showing the data writing operation. In an example shown in FIG. 34, data "1" is written into a memory cell MC which is connected to a 0th word line X and a 0th bit line pair Y, and data "0" is written into the other memory cells MC. As shown in FIG. 34, in the writing operation, a Y address as well as the operation start command ACT is input at the timing of the clock CL1, and an X address and input data as well as the write command WRT are input at the timing of the clock CL3. Then, in response to the input of the write command WRT, the X address, and the input data at the timing of the clock CL3, the clear signal CLR rises during a period between the clock CL3 and a clock CL4. According to the rise of the clear signal CLR, the bit lines DT become low level from a precharge voltage (for example, VDD/2). On the other hand, contrary to the bit lines DT, the bit lines DB become high level from the precharge voltage (for example, VDD/2) owing to an amplification operation of the write amplifiers. As a result, each bit line pair is set as a state of data "0". In other words, all the memory cells MC hold the data "0". During a period after the clock CL4, the clear signal CLR falls so that data is written into the memory cells MC.

Then, the data is written into the memory cells MC during a period from the clock CL4. In the example shown in FIG. 34, the number of memory cells MC into which data "1" is written is one (only memory cell connected to 0th bit line pair Y). For this reason, the potential of the 0th bit line pair Y is inverted at the timing of the clock CL 4, whereby the data "1" is written into the memory cell MC connected to the 0th bit line pair Y. In this case, in Embodiment 7, for the memory cell MC into which the data "0" is written, the writing operation is not performed since a reset value of the memory cell and a value of data to be written are the same.

As described above, in the semiconductor memory device 1 according to Embodiment 8, the memory cells MC are reset once before data is written into the memory cells MC, and the data writing operation is performed only for the memory cells MC having a data value different from that in the reset state. Specifically, even when another data is already written in the memory cells MC, the data stored in the memory cells MC is reset by the resetting operation. As a result, in the semiconductor memory device 1 according to Embodiment 8, irrespective of the data stored in the memory cells MC, the writing operation is thereafter performed only for the memory cells MC which store write data having a value different from that in the reset state. Accordingly, the number of memory cells MC to be subjected to the data writing operation can be reduced, with the result that the time required for the data writing operation can be reduced.

Embodiment 9

Figure 35:
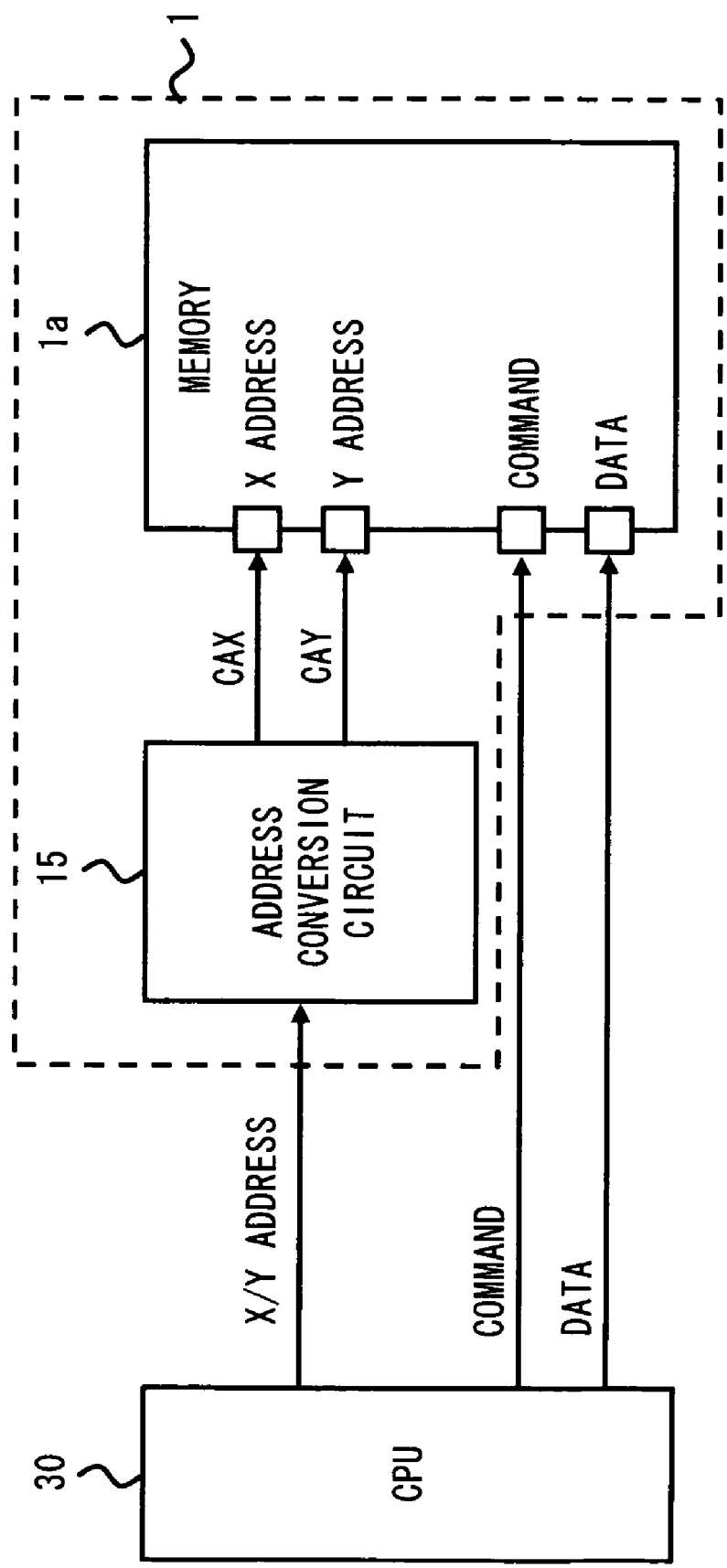
FIG. 35 is a block diagram showing a semiconductor memory device according to Embodiment 9 of the present invention.

In an example illustrated in Embodiment 9 of the present invention, the address conversion circuit 15 of the semiconductor memory device 1 according to Embodiment 1 is replaced with a semiconductor device different from that of other blocks. FIG. 35 is a block diagram showing the semiconductor memory device 1 according to Embodiment 9. As shown in FIG. 35, the semiconductor memory device 1 according to Embodiment 9 is provided as a semiconductor device which is different from that of Embodiment 1 in that a memory 1a having blocks other than the address conversion circuit 15 is provided and the address conversion circuit 15 is provided in a different manner. The address conversion circuit 15 is provided between the memory 1a and a CPU 30. The address conversion circuit 15 according to Embodiment 9 receives an X address and an Y address from the CPU 30, and converts the received X address and Y address into a cell array row address CAX and a cell array column address CAY in the same manner as in the above embodiments, to thereby output the X address and the Y address to the memory 1a. Note that, also in Embodiment 9, commands and data are directly input from the CPU 30 to the memory 1a.

In a case of transmitting address data to a typical SDRAM or the like, the CPU 30 transmits the Y address corresponding to the cell array row address CAX, as well as the operation start command ACT, and also transmits the X address corresponding to the cell array column address CAY, as well as the read command RED or the write command WRT. Then, the address conversion circuit 15 generates the cell array row address CAX and the cell array column address CAY to be input to the memory 1a, by using a part of each of the X address and the Y address. Accordingly, in Embodiment 9, the address data transmission method for the CPU 30 is changed into a method different from that of the other embodiments.

Figure 36:
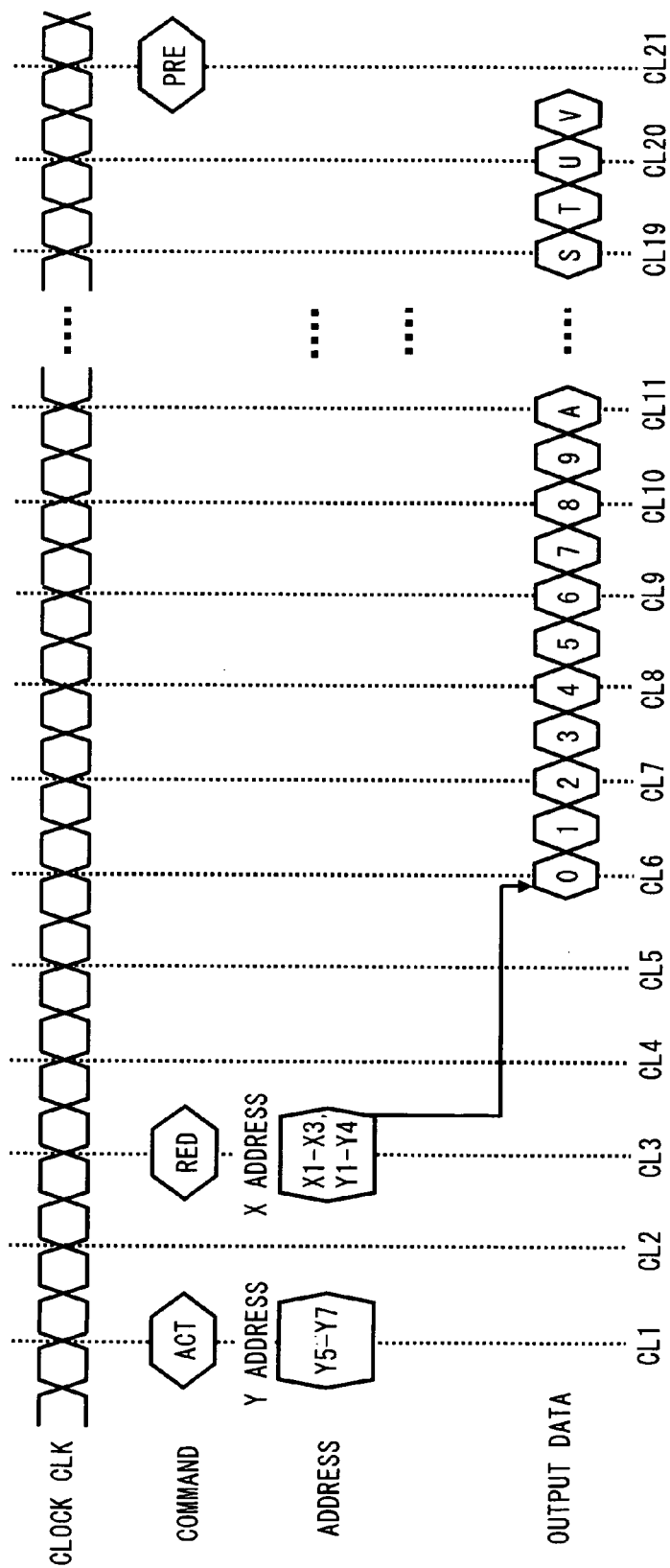
FIG. 36 is a timing chart showing a reading operation of the semiconductor memory device according to Embodiment 9.

FIG. 36 is a timing chart showing a reading operation according to Embodiment 9. In an example illustrated in FIG. 36, an operation similar to that shown in FIG. 29 is applied to the semiconductor memory device 1 according to Embodiment 9. As shown in FIG. 36, in Embodiment 9, the CPU 30 transmits bits from a 5th-bit to a 7th-bit of a Y address, which are used as the cell array row address CAX, as well as the operation start command ACT. Then, the address conversion circuit 15 outputs the cell array row address CAX to the memory 1a based on the received address data. After that, bits from a 1st-bit to a 4th-bit of the Y address and bits from a 1st-bit to a 3rd-bit of an X address, which are used as the cell array column address CAY, as well as the read command READ are transmitted. Then, the address conversion circuit 15 outputs the cell array column address CAY to the memory 1a based on the received address data.

Figure 37:
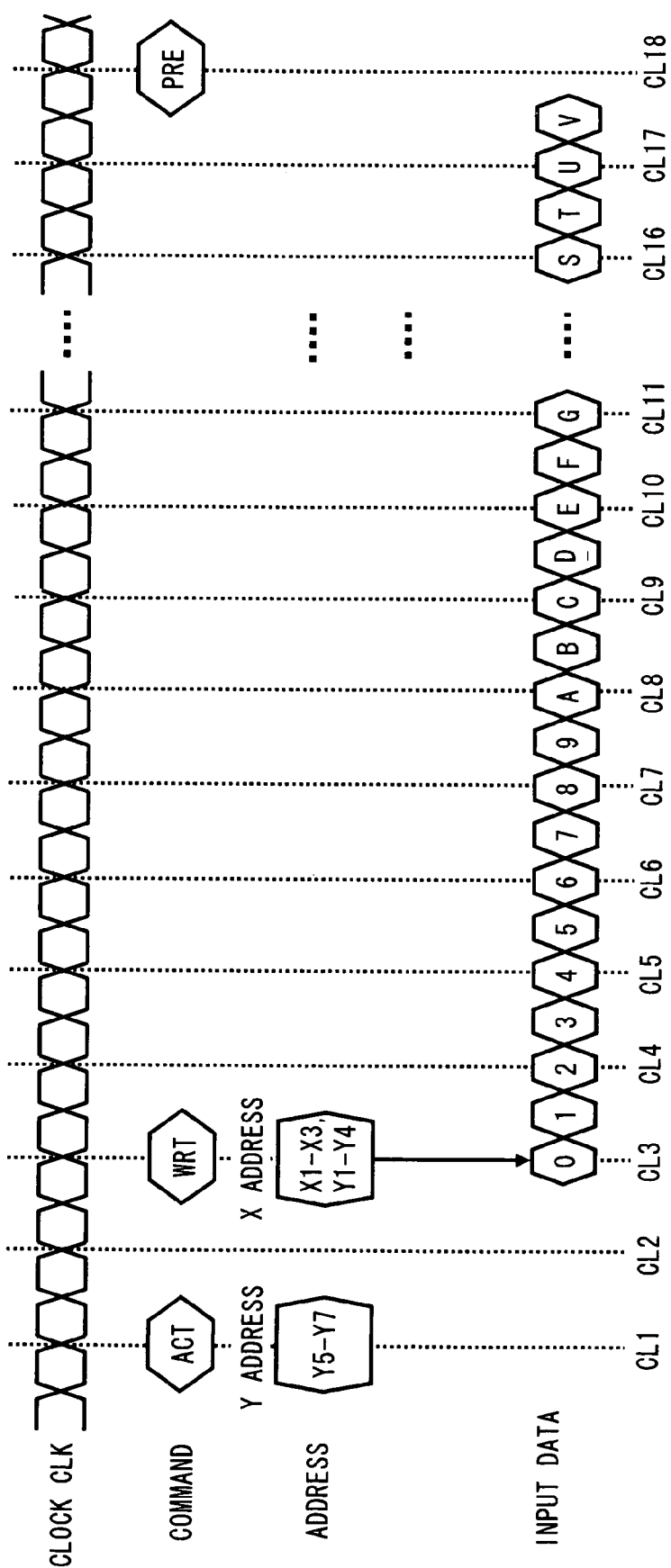
FIG. 37 is a timing chart showing a writing operation of the semiconductor memory device according to Embodiment 9.

FIG. 37 is a timing chart showing a writing operation according to Embodiment 9. In an example illustrated in FIG. 37, an operation similar to that shown in FIG. 30 is applied to the semiconductor memory device 1 according to Embodiment 9. As shown in FIG. 37, in Embodiment 9, the CPU 30 transmits bits from a 5th-bit to a 7th-bit of a Y address, which are used as the cell array row address CAX, as well as the operation start command ACT, to the address conversion circuit 15. Then, the address conversion circuit 15 outputs the cell array row address CAX to the memory 1a based on the received address data. After that, the CPU 30 transmits bits from a 1st-bit to a 4th-bit of the Y address and bits from a 1st-bit to a 3rd-bit of an X address, which are used as the cell array column address CAY, as well as the read command RED, to the address conversion circuit 15. Then, the address conversion circuit 15 outputs the cell array column address CAY to the memory 1a based on the received address data.

As described above, by changing the address output method for the CPU 30, even when the address conversion circuit 15 is provided as another semiconductor device, the same operations as those of the above embodiments can be attained. Further, when another semiconductor device is provided as the address conversion circuit 15, the use of a typical memory enables the reduction in power consumption and the high-speed memory access, as in the above embodiments.

Embodiment 10

Figure 38:
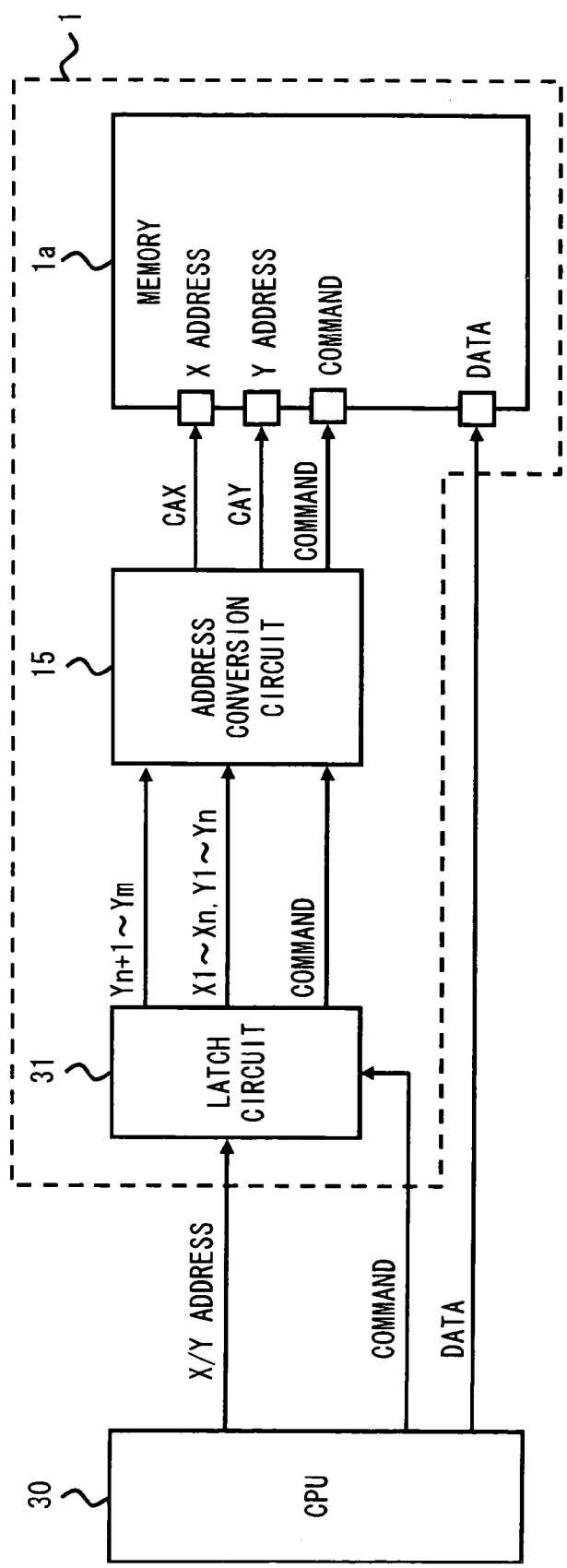
FIG. 38 is a block diagram showing a semiconductor memory device according to Embodiment 10 of the present invention.

In Embodiment 9, it is necessary to select and output address data to be output by the CPU 30 each time. In the case of selectively outputting addresses, there arises a problem in that the operation of the CPU 30 is complicated. In view of this, in Embodiment 10 of the present invention, at a pre-stage of the address conversion circuit 15 according to Embodiment 9, a latch circuit 31 is provided. FIG. 38 shows a block diagram of the semiconductor memory device 1 including the latch circuit 31.

The latch circuit 31 receives address data and command data which are output from the CPU 30, and temporarily stores the address data, to thereby selectively output addresses in response to the received command. The latch circuit 31 outputs the command data received in synchronization with the selected address data, to the address conversion circuit 15. For example, when the latch circuit 31 receives an X address and a Y address from the CPU 30 and the CPU 30 outputs the operation start command ACT, the latch circuit 31 outputs bits from a 5th-bit to a 7th-bit of the Y address, which are used as the cell array row address CAX, in synchronization with the operation start command ACT. Further, when the CPU 30 outputs the read command RED or the write command WRT, the latch circuit 31 outputs bits from a 1st bit to a 4th-bit of the Y address and bits from a 1st-bit to a 3rd-bit of the X address, which are used as the cell array column address CAY, in synchronization with the read command RED or the write command WRT.

Figure 39:
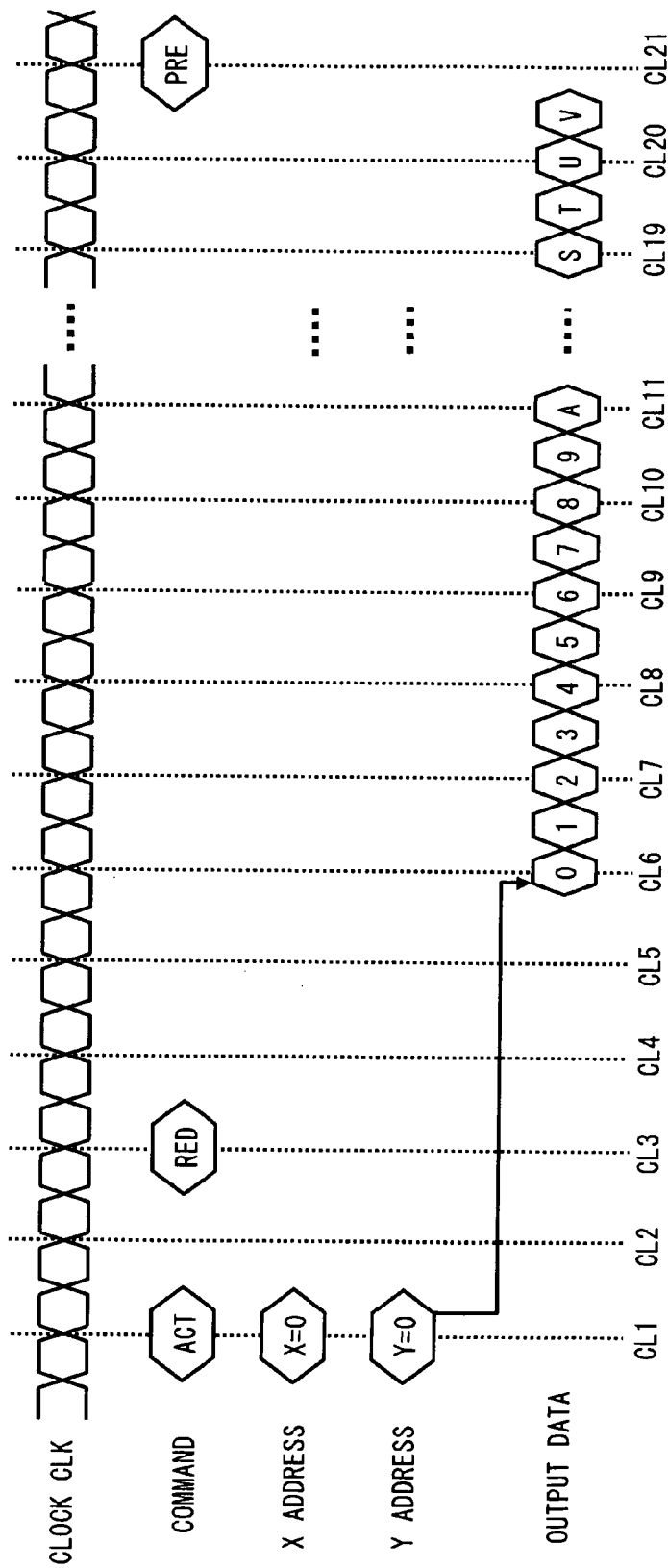
FIG. 39 is a timing chart showing a reading operation of the semiconductor memory device according to Embodiment 10.

FIG. 39 is a timing chart showing a reading operation according to Embodiment 10. In an example illustrated in FIG. 39, an operation similar to that shown in FIG. 29 is applied to the semiconductor memory device 1 according to Embodiment 10. As shown in FIG. 39, in Embodiment 10, the CPU 30 transmits the X address and the Y address as well as the operation start command ACT. Then, the latch circuit 31 transmits bits from a 5th-bit to a 7th-bit of the Y address, which are used as the cell array row address CAX, as well as the operation start command ACT, to the address conversion circuit 15. The address conversion circuit 15 outputs the cell array row address CAX to the memory 1a based on the received address data. After that, the latch circuit 31 transmits bits from a 1st-bit to a 4th-bit of the Y address and bits from a 1st-bit to a 3rd-bit of the X address, which are used as the cell array column address CAY, as well as the read command RED, to the address conversion circuit 15. The address conversion circuit 15 outputs the cell array column address CAY to the memory 1a based on the received address data.

Figure 40:
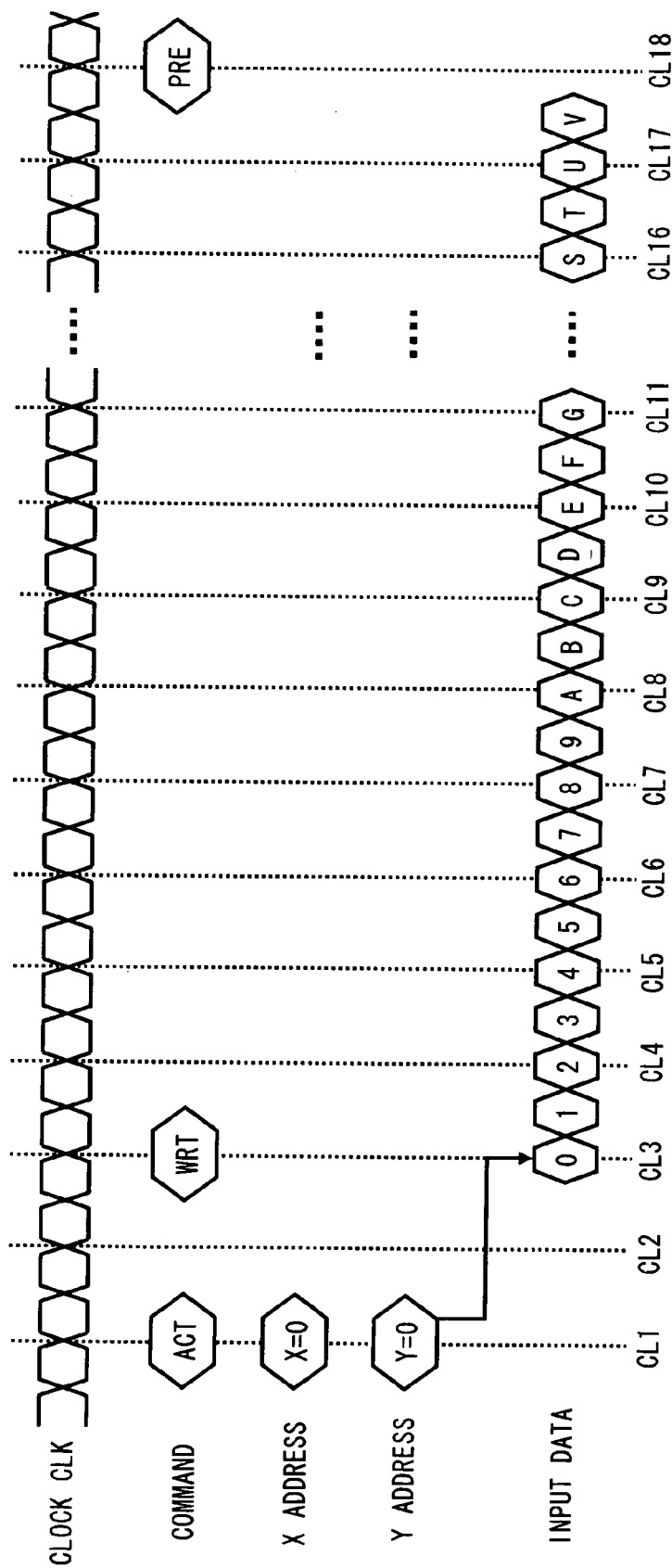
FIG. 40 is a timing chart showing a writing operation of the semiconductor memory device according to Embodiment 10.
Figure 41:
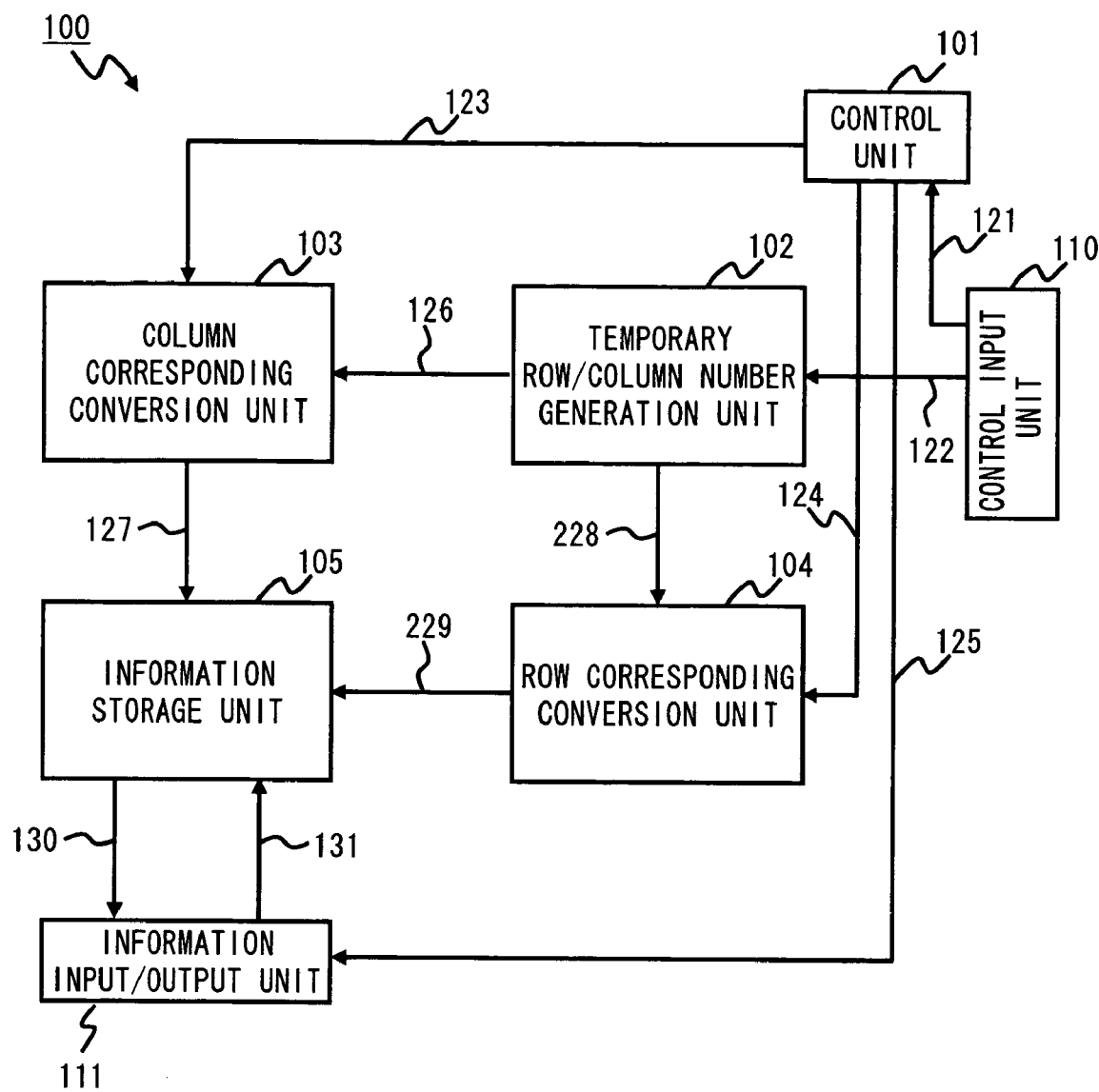
FIG. 41 is a block diagram of a semiconductor memory device disclosed in Japanese Unexamined Patent Application Publication No. 05-120121.
Figure 42:
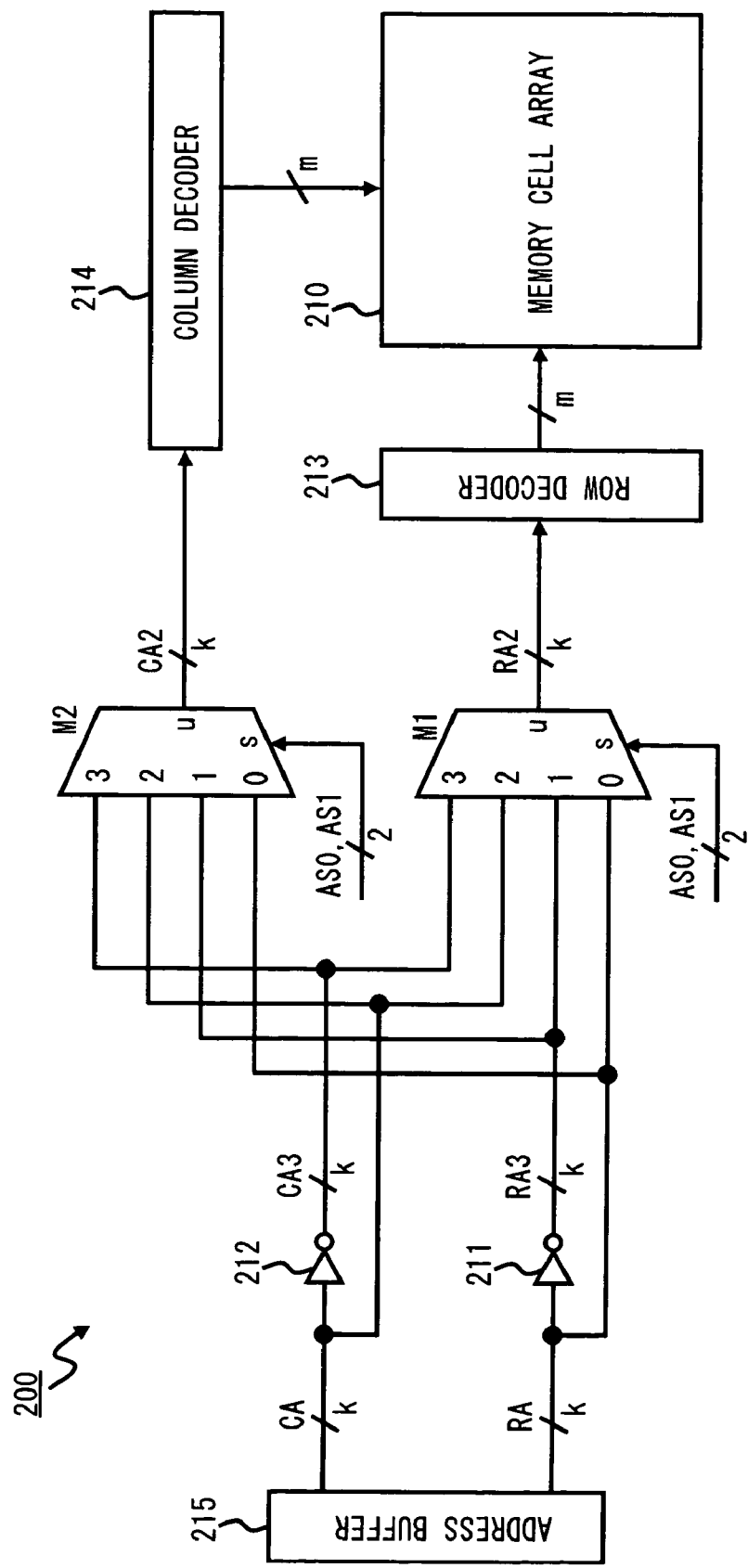
FIG. 42 is a block diagram showing a semiconductor memory device disclosed in Japanese Unexamined Patent Application Publication No. 09-259035.
Figure 43:
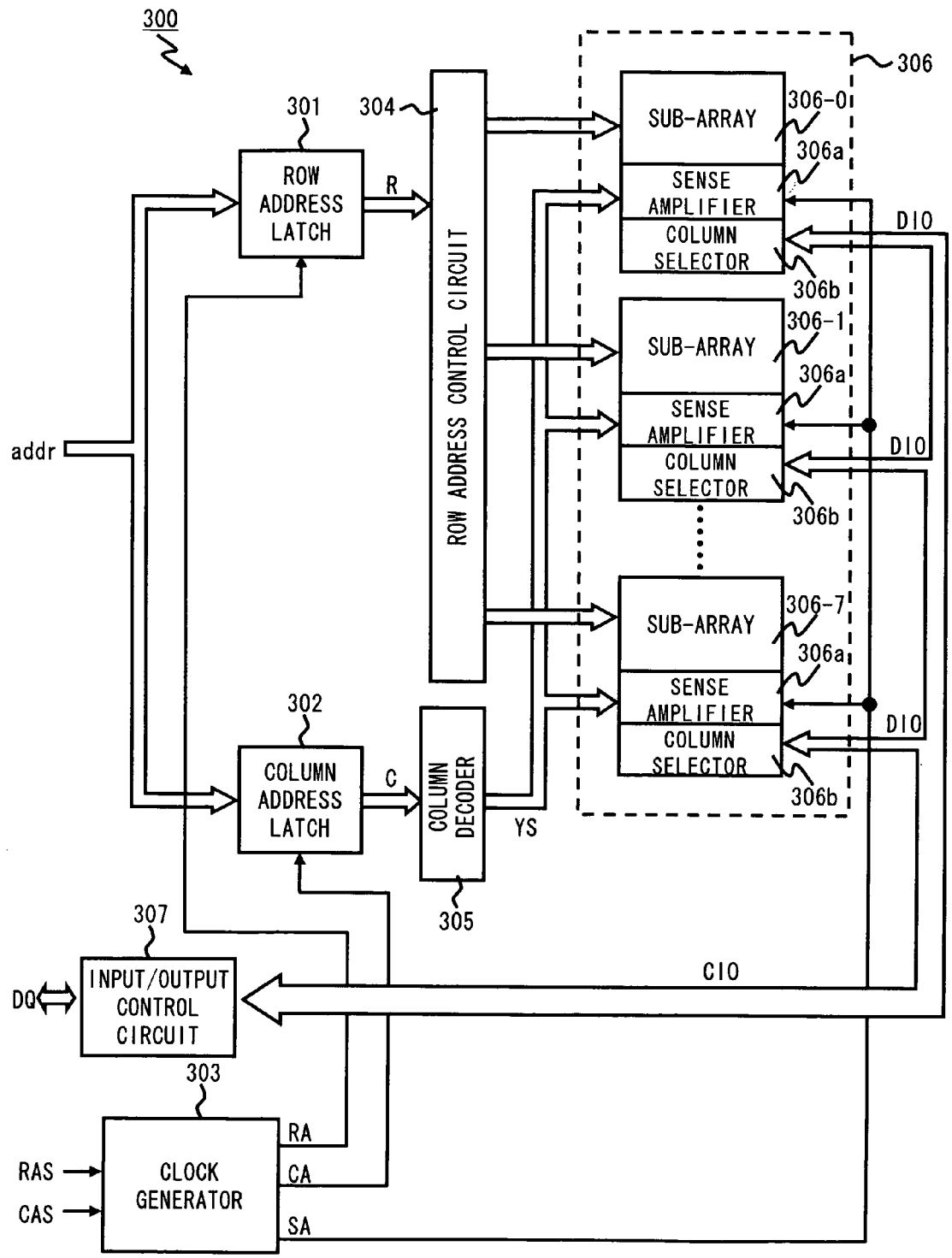
FIG. 43 is a block diagram showing a semiconductor memory device disclosed in Japanese Unexamined Patent Application Publication No. 10-112179.
Figure 44:
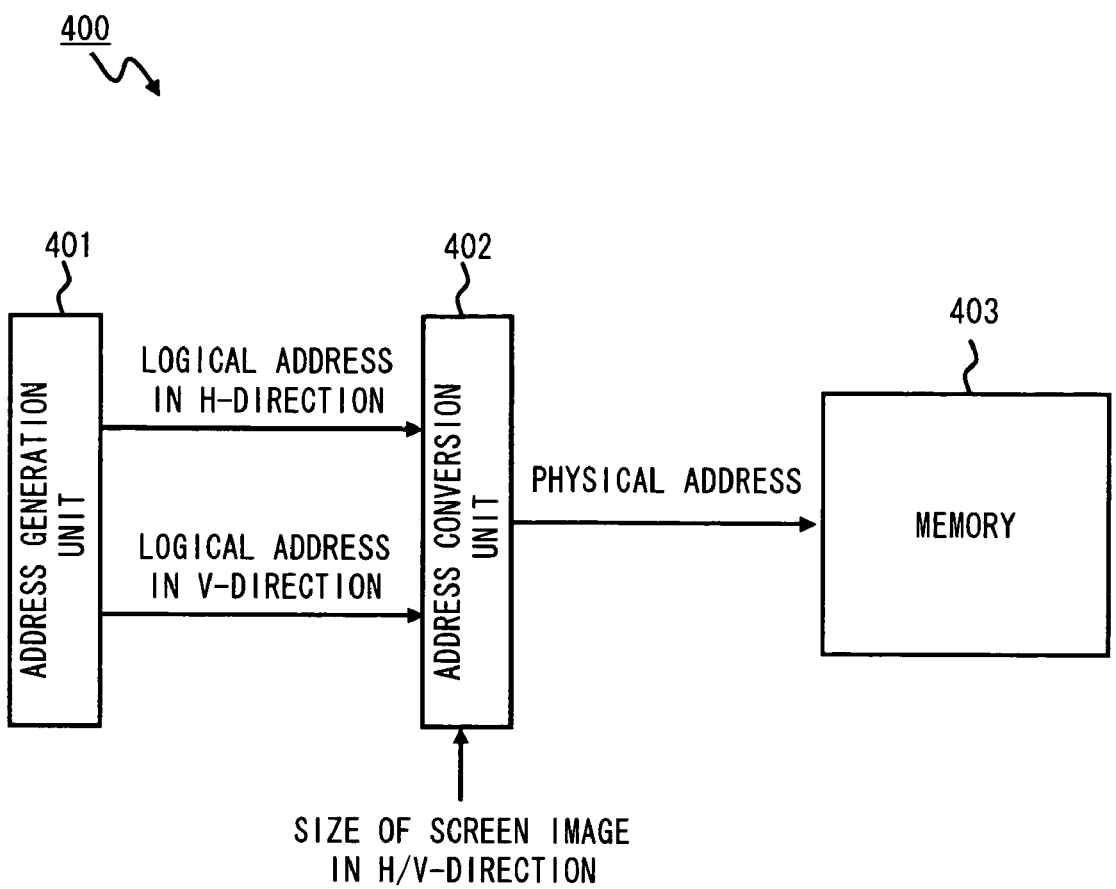
FIG. 44 is a block diagram showing a semiconductor memory device disclosed in Japanese Unexamined Patent Application Publication No. 05-257458.

Further, FIG. 40 is a timing chart showing a writing operation according to Embodiment 10. In an example illustrated in FIG. 40, an operation similar to that shown in FIG. 30 is applied to the semiconductor memory device 1 according to Embodiment 10. As shown in FIG. 40, in Embodiment 10, the latch circuit 31 transmits bits from a 5th-bit to a 7th-bit of a Y address, which are used as the cell array row address CAX, to the address conversion circuit 15 in synchronization with the operation start command ACT. Then, the address conversion circuit 15 outputs the cell array row address CAX to the memory 1a based on the received address data. After that, the latch circuit 31 transmits bits from a 1st-bit to a 4th-bit of the Y address and bits from a 1st-bit to a 3rd-bit of an X address, which are used as the cell array column address CAY, as well as the write command WRT, to the address conversion circuit 15. The address conversion circuit 15 outputs the cell array column address CAY to the memory 1a based on the received address data.

As described above, by providing the latch circuit 31 according to Embodiment 10, the CPU 30 can output addresses without selecting the addresses to be output. As a result, the operation of the CPU 30 is simplified, and a program to be run on the CPU 30 can be simply designed.

It is apparent that the present invention is not limited to the above embodiments, but may be modified and changed without departing from the scope and spirit of the invention. For example, the present invention can be applied to any memory device having memory cells arranged in a lattice pattern. The present invention can be applied not only to a DRAM but also to a flash memory and the like. In the above description, the data reading operation is mainly described, but the same effects as those of the reading operation can be obtained also in the writing operation. Further, the above-mentioned conversion method and input method of inputting addresses to a semiconductor memory device can be achieved also by program description. When the above-mentioned operations are realized by using a program, there is no need to change hardware.

What is claimed is:

1. A semiconductor memory device to store data defining a multidimensional space, based on coordinate information of the data, the semiconductor device comprising:
   a cell array including memory cells arranged in a lattice pattern to store the data;
   a word line selector selecting and driving any one of a plurality of word lines to activate the memory cells arranged in a row direction;
   a plurality of write amplifiers and a plurality of sense amplifiers writing and reading the data to and from the memory cells, respectively, arranged in a column direction;
   an amplifier selector selecting any one of a plurality of pairs of the write amplifiers and the sense amplifiers to input and output the data to and from the selected one of the plurality of pairs of the write amplifiers and the sense amplifiers, respectively; and
   an address conversion circuit generating a row address to be supplied to the word line selector based on the coordinate information of the data, and to generate a column address to be supplied to the amplifier selector by converting the coordinate information of the data into one-dimensional information.

2. The semiconductor memory device according to claim 1, wherein the address conversion circuit generates the row address by using bit values of a plurality of pieces of data having common values as address values indicating the coordinate information.

3. The semiconductor memory device according to claim 1, wherein the address conversion circuit generates the column address by using a combination of bit values of a plurality of pieces of data having different values as address values indicating the coordinate information.

4. The semiconductor memory device according to claim 1, wherein the address conversion circuit assigns a terminal address to an input/output terminal number associated with the data to generate the column address with a combination of the terminal address and the coordinate information.

5. The semiconductor memory device according to claim 1, wherein the address conversion circuit assigns a data address to each bit of a plurality of bits when a value of the data is set by using the plurality of bits, to generate the column address by using a combination of the data address and the coordinate information.

6. The semiconductor memory device according to claim 1, wherein the address conversion circuit divides a size of the space into small spaces each having a size defined by using the number of data represented by a power of 2, and assigns a small space address to a number indicating each of the small spaces, to generate the column address by using a combination of the small space address and the coordinate information.

7. The semiconductor memory device according to claim 1, wherein the address conversion circuit includes a plurality of image mapping circuits corresponding to each size of the space of the data, and selects one of the image mapping circuits in response to an image size selection signal for specifying the size of the space of the data.

8. The semiconductor memory device according to claim 7, wherein the plurality of image mapping circuits each perform address conversion according to a rule predefined for each size of the space of the data.

9. The semiconductor memory device according to claim 1, wherein the semiconductor memory device performs a burst operation to sequentially input and output a plurality of pieces of data.

10. The semiconductor memory device according to claim 1, wherein the semiconductor memory device performs a full page operation to access the plurality of memory cells connected to a single word line through one address input.

11. The semiconductor memory device according to claim 1, further comprising a reset control circuit to control all the memory cells to be brought into a reset state before writing the data to the plurality of memory cells.

12. The semiconductor memory device according to claim 1, wherein the semiconductor memory device is formed on a semiconductor substrate having the address conversion circuit different from other functional blocks.

13. The semiconductor memory device according to claim 12, further comprising a latch circuit to temporarily store address data transmitted from a transmission-side device to a pre-stage of the address conversion circuit so as to transmit address data selected from among the address data to the address conversion circuit in response to a command signal transmitted from the transmission side device, for specifying an operation of the semiconductor memory device.

* * * * *